United States Patent
Scherer

(10) Patent No.: US 6,831,280 B2
(45) Date of Patent: Dec. 14, 2004

(54) METHODS AND APPARATUS FOR PRECISE MEASUREMENT OF TIME DELAY BETWEEN TWO SIGNALS

(75) Inventor: Ernst F. Scherer, Hamilton, MA (US)

(73) Assignee: Axcelis Technologies, Inc., Beverly, MA (US)

(*) Notice: Subject to any disclaimer, the term of this patent is extended or adjusted under 35 U.S.C. 154(b) by 85 days.

(21) Appl. No.: 10/368,825

(22) Filed: Feb. 19, 2003

(65) Prior Publication Data

US 2004/0056210 A1 Mar. 25, 2004

Related U.S. Application Data

(60) Provisional application No. 60/412,751, filed on Sep. 23, 2002.

(51) Int. Cl.[7] .............................................. G06F 15/20
(52) U.S. Cl. .................. 250/492.21; 250/287; 250/283; 364/569; 328/129.1
(58) Field of Search ........................... 250/492.21, 287, 250/283; 364/569; 328/129.1

(56) References Cited

U.S. PATENT DOCUMENTS

| | | | |
|---|---|---|---|
| 3,896,378 A | * 7/1975 | Bedford | ....................... 368/120 |
| 4,125,835 A | 11/1978 | Barry | |
| 4,604,717 A | * 8/1986 | Kaplan | ........................ 702/79 |
| 4,667,111 A | 5/1987 | Glavish et al. | |
| 4,818,100 A | 4/1989 | Breen | |
| 5,388,461 A | 2/1995 | Rigby | |
| 5,396,065 A | 3/1995 | Myerholtz et al. | |
| 5,543,624 A | 8/1996 | Bergmann | |
| 5,591,969 A | 1/1997 | Park et al. | |
| 5,614,711 A | 3/1997 | Li et al. | |
| 5,691,537 A | 11/1997 | Chen et al. | |
| 6,137,112 A | * 10/2000 | McIntyre et al. | ...... 250/492.21 |

* cited by examiner

Primary Examiner—John R. Lee
Assistant Examiner—Zia R. Hashmi
(74) Attorney, Agent, or Firm—Eschweiler & Associates, LLC

(57) ABSTRACT

Apparatus and methods are disclosed for measuring time delays between pulse streams or other input signals and for measuring ion beam energies in an ion implantation system. A variable delay apparatus is applied to one input signal, and the signals are correlated or compared in a correlator apparatus providing a minimum, maximum, or other ascertainable output signal value when a delay value of the variable delay is representative of the time delay between the first and second input signals. By adjusting or sweeping the variable delay until the ascertainable correlator apparatus output value is obtained, the actual time delay is determined as the dialed-in value of the variable delay that produces the ascertainable correlator output value. The variable delay measurement apparatus and methods may be employed in ion implantation system for measuring ion beam energies using time of flight probes, wherein the system and the time delay measurement apparatus may be calibrated to remove any residual delays of the system, such as delay offsets related to channel imbalance in the system and connecting devices. In addition, a unique error correction method is disclosed, which may be applied to the time delay measurement system measurement to minimize or mitigate errors introduced by electronic components of the system.

32 Claims, 13 Drawing Sheets

METHODS AND APPARATUS FOR PRECISE MEASUREMENT OF TIME DELAY BETWEEN TWO SIGNALS

RELATED APPLICATION

This application claims priority to and the benefit of Ser. No. 60/412,751 filed Sep. 23, 2002, which is entitled "METHODS AND APPARATUS FOR PRECISE MEASUREMENT OF TIME DELAY BETWEEN TWO PULSE STREAMS", the entirety of which is hereby incorporated by reference as if fully set forth herein.

INCORPORATION BY REFERENCE

The disclosures of U.S. Pat. No. 6,137,112 to McIntyre et al., U.S. Pat. No. 5,691,537 to Chen et al., and U.S. Pat. No. 4,667,111 to Glavish et al. are hereby incorporated by reference as if fully set forth herein.

FIELD OF THE INVENTION

The present invention relates generally to time delay measurements and more particularly to apparatus and methods for measuring time delays between signals and time of flight energy measurement systems for use in ion implantation systems.

BACKGROUND OF THE INVENTION

Measurement of time delays are needed or desired in a variety of situations, such as for measuring the average kinetic energy of ion beam ions in ion implantation systems for ion doping semiconductor workpieces, time of flight (TOF) measurements in particle accelerators, signal processing, echo sounding, etc., wherein there is a need for precise determination of the time delay between two pulse streams, such as those derived from a common frequency (clock). Some conventional systems trigger on a signal waveform to obtain a timing reference (time stamping) for real-time waveform display or data recording (e.g., scope, data acquisition). The timing accuracy (e.g., time jitter) in such approaches is strongly dependent on the rise-time (e.g., slope, or waveform) of the pulse, and deteriorates rapidly with decreasing signal-to-noise ratio (SNR) (e.g., small signal amplitudes).

In ion implantation systems or ion implanters, time delay measurements are used in time of flight energy measurement systems for measuring ion beam energy. Any inaccuracies in the time delay measurement in such systems leads to inaccuracies in determining the actual energy of the ion beam being used to implant semiconductor wafers or other workpieces. Accordingly, there is a need for improved time delay measurement systems and methods for determining a time delay between two input signals and improved energy measurement systems for ion implanters by which better time delay and energy measurements can be achieved.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed to methods and apparatus for measuring time delays between pulse streams or other input signals, which may be employed in any number of applications in which time delay measurements are desired, including but not limited to ion implantation systems. One aspect of the invention relates to time delay measurement systems which may be employed in ion implantation systems for determining ion beam energy, particle accelerators, signal processing, echo sounding, or other applications. A time delay measurement system is provided, comprising first and second input channels receiving first and second input signals, wherein the input signals may be of any character, for example, such as electrical pulse signals or pulse streams obtained from time of flight (TOF) system probes in an ion implanter. In such an example, the pulses may represent passage of groups or bunches of ions through or past the TOF system probes along an ion beam path.

A delay apparatus is associated with one of the channels, which provides a variable delay to a corresponding one of the input signals, and a correlator apparatus is provided having first and second correlator inputs receiving outputs from the first and second channels, respectively. The correlator apparatus provides a correlator output signal having an ascertainable correlator output value, such as a local minima, local maxima, or other discernable signal value, when the outputs from the first and second channels are substantially aligned in time. The variable delay may be manually or automatically adjusted by measurement circuitry (e.g., such as a time of flight energy measurement circuit in an ion implantation system), while the correlator output is monitored to determine a delay value corresponding to the ascertainable correlator output value when the outputs from the first and second channels are substantially aligned in time. For instance, the measurement circuitry may sweep the variable delay value and search for a relative minima or other ascertainable value at the correlator output. At this point, the time delay between the input signals is determined to be the delay value at which the ascertainable correlator output value is reached.

In another aspect of the invention, the time delay measurement system further comprises amplitude adjustment apparatus, which operates to selectively adjust a gain associated with one of the channels, wherein the measurement circuitry may operate to selectively control the delay apparatus and the amplitude adjustment apparatus. This feature allows the variable delay value to be initially adjusted or swept (e.g., while holding the amplitude constant) to determine a first delay value corresponding to the ascertainable correlator output value when the channel outputs are substantially aligned in time. Thereafter, the delay is held at this first delay value while a gain of one of the channels is swept or otherwise adjusted by the amplitude adjustment apparatus while the correlator output signal is monitored. A first gain value is thus determined corresponding to the ascertainable correlator output value, after which another delay sweep may be performed to identify a refined delay value. This technique of alternatively adjusting the variable delay and the variable amplitude may be repeated any number of times to refine the time delay estimate using the correlator apparatus to indicate substantial or exact temporal alignment of the first and second channel outputs.

In yet another aspect of the invention, the time delay measurement system may further comprise an error correction circuit disposed between input signals and the first and second channels. During calibration, the error correction circuit provides one of the input signals to both channels having substantially equal amplitudes and no relative time delay therebetween.

Still further aspects of the invention provide ion implantation systems and time of flight ion beam energy measurement systems therefor, for measuring an average kinetic energy of an ion included in a selected ion pulse of an ion beam. The time of flight ion beam energy measurement system comprises first and second sensors spaced apart from one another by a sensor distance along an ion beam path. The second sensor is located downstream of the first sensor along the path, wherein the first sensor generates a first sensor signal when an ion pulse of the ion beam passes the first sensor and the second sensor generates a second sensor signal when the ion pulse passes the second sensor. The time of flight system further comprises a time delay measurement system for measuring a time delay between the first and second sensor signals, comprising a delay apparatus and a correlator apparatus such as those described above.

The time of flight system also comprises measurement circuitry receiving the correlator output signal, the measurement circuitry being adapted to control the delay apparatus to selectively adjust the variable delay while monitoring the correlator output signal, to determine a first delay value corresponding to the ascertainable correlator output value when the outputs from the first and second channels are substantially aligned in time. A measured ion beam energy may then be determined by the measurement circuitry according to the first delay value, a mass of particles in the ion beam, and the sensor spacing distance.

The time delay measurement system may further comprise amplitude adjustment apparatus allowing sweeping or adjustment of a gain associated with one of the channels. In one example, the measurement circuitry operates to set the variable delay to the first delay value, selectively adjust the gain while monitoring the correlator output signal and determine a first gain value corresponding to the ascertainable correlator output value, set the gain to the first gain value, and again adjust the variable delay while monitoring the correlator output signal. The measurement circuitry may then determine a second delay value corresponding to the ascertainable correlator output value when the outputs from the first and second channels are substantially aligned in time, and determine a measured ion beam energy according to the second delay value, the mass of particles in the ion beam, and the sensor distance.

Another aspect of the invention involves methods for measuring a time delay between first and second input signals, which may be employed in measurement of time delays in ion implantation systems, particle accelerators, test equipment, signal processing, echo sounding, or other applications wherein measurement of time delays is desired. The methods comprise providing a variable time delay in one of the input signals, correlating the input signals, such as through subtraction, to generate a correlated output signal, adjusting the variable time delay to a value at which the correlated output signal is an ascertainable value when the input signals are substantially aligned in time, and determining a measured time delay according to the delay value at which the correlated output signal is the ascertainable value. The methods may further comprise adjusting a variable amplitude in one of the input signals to a value at which the correlated output signal is a minimum, and again adjusting the variable time delay to a delay value at which the correlated output signal is at the ascertainable value before determining the measured time delay.

Still another aspect of the invention provides methods for measuring an average kinetic energy of particles in an ion beam. The method comprises inputting first and second input signals from spaced ion beam sensors in an ion implantation system, providing a variable time delay in one of the input signals, and correlating the signals to generate a correlated output signal. The method further comprises adjusting the variable time delay to a delay value at which the correlated output signal is an ascertainable value when the input signals are substantially aligned in time, and determining a measured beam velocity according to the delay value at which the correlated output signal is the ascertainable value and according to a spacing distance between the sensors. An average kinetic energy of particles in the ion beam is then computed according to the measured beam velocity and a mass of particles in the ion beam. The method may further comprise adjusting a variable amplitude in one of the input signals to a value at which the correlated output signal is the ascertainable value, and again adjusting the variable time delay to a delay value at which the correlated output signal is the ascertainable value when the input signals are temporally aligned before determining the measured time delay.

Yet another aspect of the invention provides a method for calibrating a time of flight energy measurement system in an ion implantation system, the method comprising providing a DC ion beam at a known DC beam energy along a beam path in the ion implantation system, modulating the DC ion beam with a small AC component, measuring a beam energy using the time of flight energy measurement system, and calibrating the time of flight energy measurement system according to the measured beam energy and the known DC beam energy. Modulation of the DC ion beam may be accomplished, for example, by energizing an RF accelerator in the ion implantation system at a low voltage to generate pulse signals in time of flight system probes without substantially changing the average energy of the ion beam. Calibrating the time of flight energy measurement system may comprise, for example, computing an energy offset value according to the measured beam energy and the known DC beam energy.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
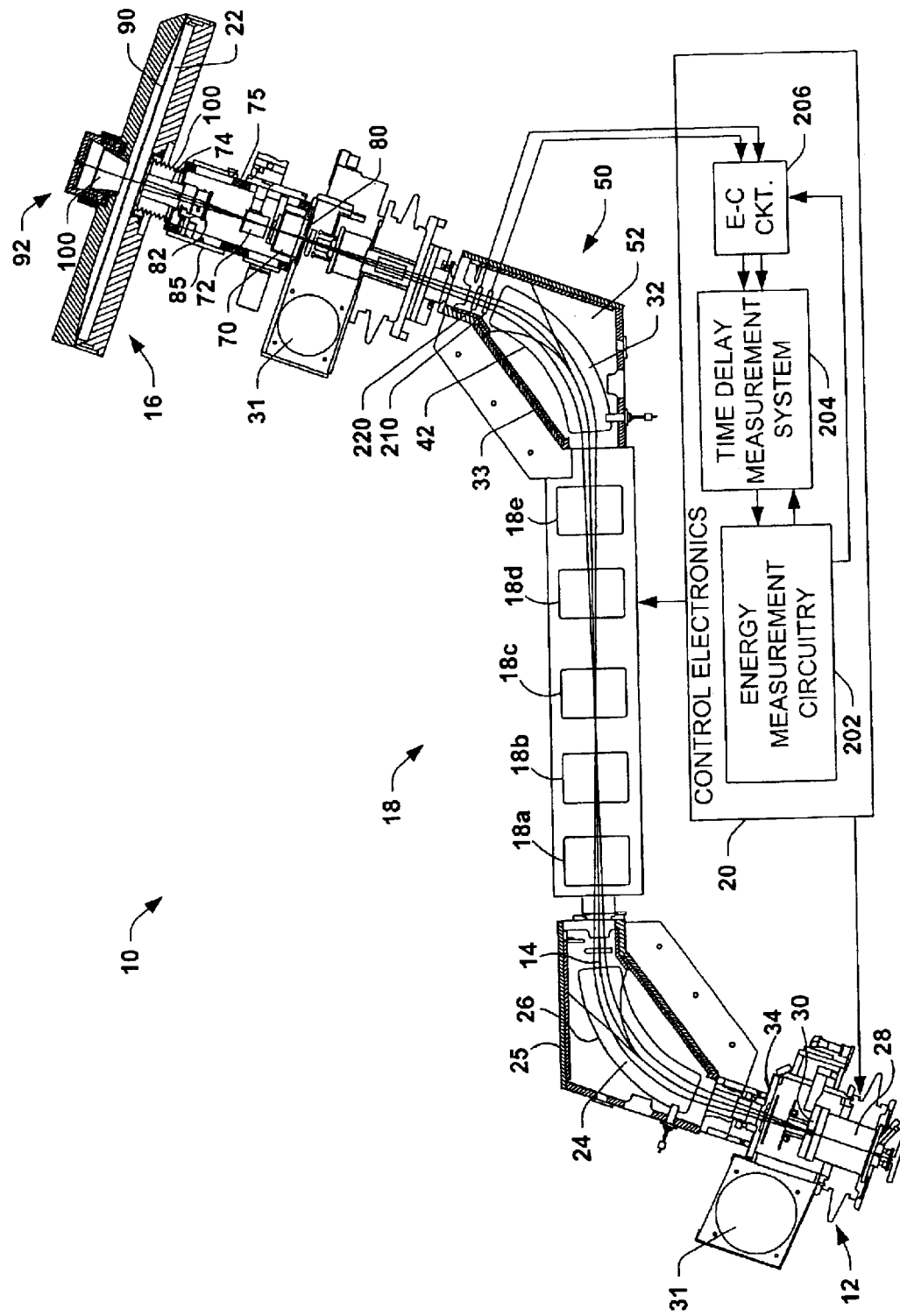
FIG. 1 is a schematic top plan view illustrating an exemplary ion beam implanter or ion implantation system having a time of flight energy measurement system with a time delay measurement system in accordance with one or more aspects of the present invention.

The present invention will now be described with reference to the attached drawings, wherein like reference numerals are used to refer to like elements throughout. The invention relates to apparatus and methods for measuring time delays between two or more signals, for example, such as electrical pulse streams from ion beam sensors or other first and second input signals, which may be employed in association with ion implantation systems or other systems in which time delay measurements are desired (e.g., particle accelerators, signal processing, echo sounding, etc.). Although illustrated and described hereinafter in the context of an exemplary ion implantation system, the time delay measurement aspects of the invention and the appended claims are not limited to employment in association with ion implanters.

In ion implantation systems, accuracy in the quantity of ions implanted in a semiconductor wafer workpiece during the implantation process, as well as accuracy in the implantation depth of ion implantation in the workpiece surface are important parameters in the production of acceptable end products, such as integrated circuit devices. Allowable tolerances on implantation depth and total ion implantation quantity or dose in the manufacture of many semiconductor devices can be as small as +/-1% in many applications. Since the ion implantation depth of workpieces in an ion beam implanter is directly dependent on the energy of the ion beam, the accuracy in achieving desired implantation depth is facilitated by accurate control, measurement, and monitoring of the energy of the ion beam, for example, in units of keV.

High energy (HE) ion implanters using RF acceleration have certain advantages over electrostatic implementations. However, beam energy from such systems is more difficult to measure than that of electrostatic systems that derive beam energy directly from voltages of the acceleration columns. In conventional electrostatic implantation systems, energy control relies upon beam collimation from a final energy magnet (FEM). The time of flight (TOF) energy measurement approach involves the calculation of the mass-specific energy of ion particles in an ion beam according to the time delay of pulses generated by two spatially separated beam current probes along a beam path, as exemplified in U.S. Pat. No. 6,137,112 assigned to the assignee of the present invention, the entirety of which is incorporated by reference as if fully set forth herein.

In the present invention, a compact and cost-effective time delay measurement system design is employed, comprising a variable delay apparatus exemplified by a precision programmable delay line and unique signal correlation apparatus. In the example illustrated herein, the complete system is fully integrated, including probes, in a self-contained unit which may be installed in the resolving chamber of an ion implantation system, facilitating implementation in existing ion implanters. However, it will be appreciated that the various aspects of the invention find utility in association with other systems and is not limited to ion implantation applications. The exemplary time of flight apparatus may advantageously be mounted in an ion implantation system or tool by removing an existing blank-off plate and substituting it with the TOF assembly. In this regard, prototype hardware has yielded a delay resolution and repeatability of better than +/-100 picoseconds (+/-0.3%). Absolute energy calibration of the system may be established through a nuclear reaction measurement, or other suitable methods. In another aspect, the energy calibration may be performed using a DC beam with slight AC modulation as described further below.

With respect to ion implantation system architecture, the current approach employs accurate time shift measurement of the continuous pulse streams generated by the two beam sensors or probes as an ion beam is transported along a beam path. One difficulty in such measurements relates to the fact that such time shifts or delays can be extremely small. For example, referring to FIG. 2B, the delay calculated from typical min/max energy ranges and mass may vary from about 30 ns to about 300 ns for the exemplary implanter illustrated and described hereinafter. In FIG. 2B, this is illustrated in a plot 150 showing delay time (ns) vs. ion energy (keV) curves for boron 152, phosphorus 154 and arsenic 156. Accordingly, to achieve a +/-1% energy resolution goal requires the processing and measuring of time delays on the order of a few tenths of a percent. In practical terms, to meet an RMS error consistent with the +/-1% energy accuracy goal, it is desirable to resolve and measure delays on the order of +/-100 ps. In theory, there are a number of techniques to measure small time delays, including beam physics based methods (inferometer, beam indexing), high end digital scopes, time interval analyzers or other such instruments similar in nature to oscilloscopes, phase meters (lock-in amplifiers), time delay generators (counters, DDSs), and programmable delay lines.

Figure 2A:
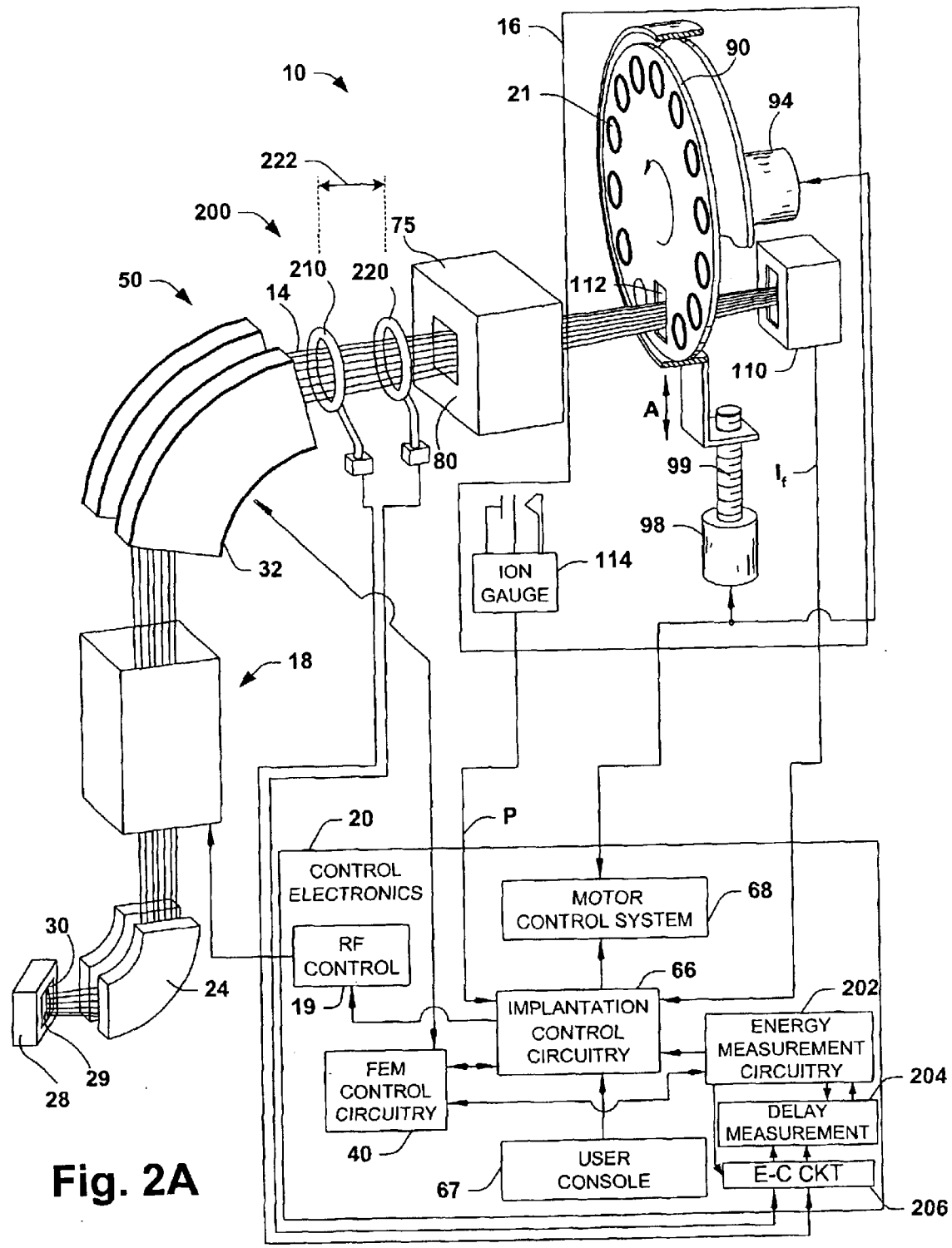
FIG. 2A is a schematic perspective view further illustrating details of the exemplary ion implantation system of FIG. 1.
Figure 2B:
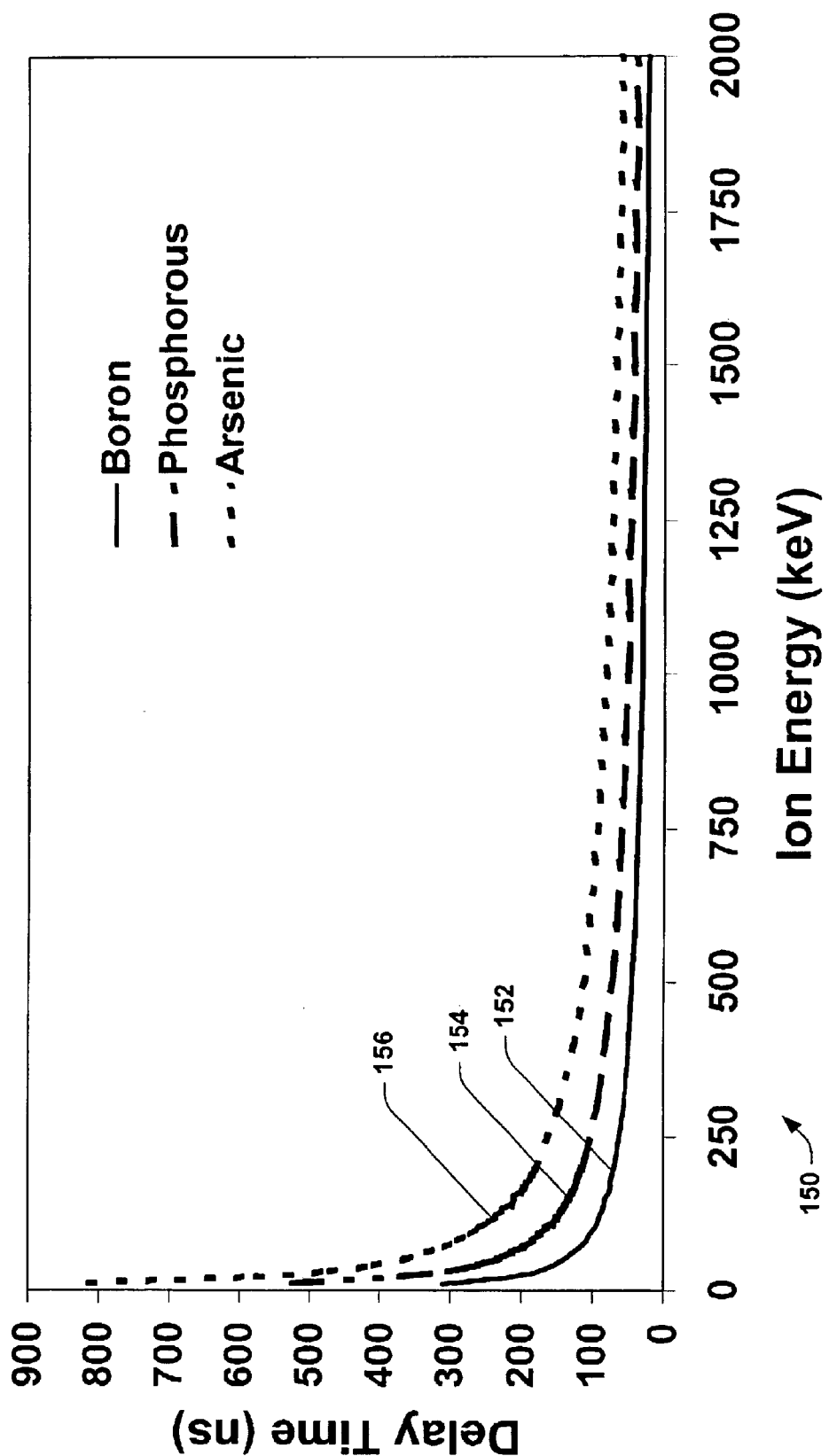
FIG. 2B is a plot illustrating exemplary delay time vs. ion energy curves for various ion species in the exemplary ion implantation system of FIGS. 1 and 2A.

In FIGS. 1 and 2A, an exemplary high-energy ion beam implanter or ion implantation system 10 is illustrated for producing an ion beam 14 having a beam energy in the range of 10–5000 keV. The implanter 10 includes an ion source 12 for providing ions that form the ion beam 14 which traverses a beam path to an implantation or end station 16. The implanter 10 utilizes a radio frequency (rf) ion accelerator 18 to accelerate ions in the ion beam 14 to suitably high velocities to achieve the desired ion beam energy. A suitable rf ion accelerator 18 for use in a high energy implanter is disclosed in U.S. Pat. No. 4,667,111 to Glavish et al., assigned to the assignee of the present invention, the entirety of which is incorporated by reference as if fully set forth herein. In a high energy implanter such as the implanter 10, the ion beam 14 can be analyzed as a train or series of discreet pulses or bunches, each of which comprises a large number of ions in the form of a group or bunch, for example, on the order of $10^{13}$ ions. Control electronics 20 are provided for monitoring and controlling the ion dosage received by a plurality of semiconductor wafer workpieces 21 within an implantation region or chamber 22 of the implantation station 16. A user console 67 permits operator input to the control electronics 20.

The ion source 12 generates the ion beam 14 which impacts the wafer workpieces 21 disposed, in one example, on a rotating and translating disk 90 in the implantation chamber 22 of the end station 16. Ions in the ion beam 14 tend to diverge as the beam 14 traverses a distance between the ion source 12 and the implantation station 16. The ion source 12 includes a plasma chamber 28 defining an interior region into which source materials are injected. The source materials may include an ionizable gas or vaporized source material. Source material in solid form is deposited into a vaporizer which is then injected into the plasma chamber 28. Where an "n" type extrinsic wafer material is desired, boron, gallium or indium may be used. Gallium and indium are solid source materials, while boron is generally injected into the plasma chamber 28 as a gas, typically boron trifluoride or diborane, because boron's vapor pressure is too low to result in a usable pressure by simply heating solid boron. If "p" type extrinsic material is to be produced, antimony, arsenic or phosphorus may be employed as the solid source material. Energy is applied to the source materials to generate positively charged ions in the plasma chamber 28. The positively charged ions exit the plasma chamber through an aperture such as an elliptical arc slit 29 (FIG. 2A) in a cover plate 30 overlying an open side of the plasma chamber 28.

The beam 14 travels along an evacuated path through an interior region 52 defined by a beam forming and directing structure 50 extending from the ion source 12 to an implantation chamber 22 at the end station 16, which is also evacuated. Evacuation of the interior region 52 defining the beam path 14 during a production run is provided by a pump system comprising a system of vacuum pumps 31. Ions in the plasma chamber 28 are extracted through the arc slit 29 of the plasma chamber cover plate 30 and are formed into the ion beam 14 that traverses the distance between the ion source 12 and the implantation station 16 by the beam forming and directing structure 50. The beam forming and directing structure or beamline assembly 50 includes a mass analyzing or resolving magnet 24, the rf ion accelerator 18, a final energy magnet (FEM) 32 and a set of extraction electrodes 34 associated with the source 12. The electrodes 34 extract the ions from the plasma chamber interior and accelerate the ions toward the mass analyzing magnet 24.

The mass analyzing magnet 24 is supported within a mass analyzing magnet housing 25 and the path of the ion beam 14 through the magnet region is bounded by an aluminum beam guide 26. In operation, the mass analyzing magnet 24 causes only those ions having an appropriate mass to charge ratio to reach the ion implantation station 16. In this regard, the ionization of source materials in the plasma chamber 28 generates a species of positively charged ions having a desired atomic mass, as well as ions having other than the desired atomic mass. Ions having an atomic mass above or below the desired atomic mass are not suitable for implantation. The magnetic field generated by the mass analyzing magnet 24 causes the ions in the ion beam 14 to move in a curved trajectory. The magnetic field that is established by the control electronics 20 is such that only ions having an atomic mass equal to the desired atomic mass traverse the curved beam path to the implantation station implantation chamber 22.

Ions with the desired atomic weight exit the mass analyzing magnet 24 and are accelerated to successively higher velocities by acceleration modules 18a, 18b, 18c, 18d, 18e of the rf ion accelerator 18. The acceleration of ions to desired energy levels is controlled by rf control electronics 19. The rf acceleration of ions in the beam by the accelerator 18 results in the ion beam 14 being comprised of a series or train of ion pulses or ion bunches. For purposes of energy measurement and analysis, the beam 14 may be considered as a series of discrete ion pulses, each comprising a large number of individual ions, such as on the order of about $10^{13}$ ions. Due to the characteristics of the rf ion accelerator 18, the frequency of the ion pulses comprising the ion beam 14 is a predetermined, known value, for example, such as 13.56 megahertz (MHz). Thus, the time period, T, between successive pulses at a given location along the beam path 14, T=1/f=1/13.56 MHz=73.75 nanoseconds (ns).

Downstream of the accelerator 18, the beam 14 traverses a magnetic field generated by the FEM 32 operating under the control of FEM control circuitry 40. The FEM 32 is supported within a housing 33 and includes an aluminum beam guide through which the ion beam 14 passes. The strength and orientation of the magnetic field produced by the FEM 32 is controlled by FEM control circuitry 40 of the control electronics 20, for example, by adjusting a current through the magnet's field windings. The FEM 32 provides an approximation of ion beam energy because the energy of the beam 14 is proportional to the magnetic energy necessary to bend the beam along the proper arcuate path such that the ion beam is directed to the target wafers 21 in the implantation chamber 22. Thus, the FEM 32 selects certain ion beam energies by allowing only ions in a certain energy range or window to pass through the FEM. Therefore, the FEM 32 controls the implantation ion energy. The FEM control of energy typically is accurate to +/−10% of a desired ion beam energy.

The beam forming and directing structure 50 also includes a quadrupole assembly 70, a resolving plate 80, a pivoting Faraday flag or cup 72 and an ion beam neutralizer 74 located downstream from the FEM 32. The quadrupole assembly 70 includes a set of electrodes oriented around the ion beam 14 which are selectively energized by the control electronics 20 to adjust the height of the ion beam 14. The quadrupole assembly 70 is supported within an implanter housing 75. Coupled to an end of the quadrupole assembly 70 facing the FEM 32 is the resolving plate 80. The Faraday cup 72 is pivotally coupled to the housing 75 so that it can be pivoted into position to intersect the ion beam 14 to measure beam characteristics and, when the measurements are satisfactory, the Faraday cup 72 is swung out of the beam line so it does not interfere with wafer workpiece implantation at the implantation chamber 22. The resolving plate 80 comprises vitreous graphite and defines an elongated aperture through which the ions in the ion beam 14 pass. The FEM 32 also functions to eliminate undesirable ion species from the ion beam 14, wherein ions having an atomic mass much larger or much smaller than the desired ion atomic mass are sharply deflected and impact the aluminum beam guide 42 or the slit boundary defined by the resolving plate 80.

The beam neutralizer 74, also known as an electron shower, neutralizes the positive charge on the ions prior to implantation of the wafers, to prevent or inhibit net positive charging of the doped wafers 21 being implanted. Electrons generated by the ion neutralizer 74 are swept downstream along the path of the ion beam 14, providing a neutral space-charge density downstream of the ion beam neutralizer 74. Directly upstream of the ion beam neutralizer 74 is a magnetic repeller 82, comprising permanent magnets for inhibiting backstreaming of electrons from the neutralizer 74. The exemplary neutralizer 74 and the repeller 82 are formed as an integral unit and are supported by a common base 85 of the implanter housing 75. A suitable ion neutralizer and magnetic repeller are disclosed in U.S. Pat. No. 5,691,537 to Chen et al. and assigned to the assignee of the present invention, the disclosure of which is incorporated in its entirety herein by reference.

The semiconductor wafers 21 are supported by a disk-shaped workpiece support 90 for batch implantation with ions in the end station or implantation chamber 22. The wafers 21 are positioned near an outer edge of the wafer support 90 and the support 90 is rotated at a constant angular velocity by a motor 92, thus allowing multiple wafers 21 to be implanted during a production run. An output shaft of the motor 92 is coupled to a support drive shaft 94 by a belt 96. Alternately, the support drive shaft 94 of the wafer support 90 may be directly coupled to the output shaft of the motor 92. The ion beam 14 strikes the wafers 21 as they rotate in a circular path at a rate of about 1200 RPM. A stepper motor 98 also drives a lead screw 99 to translate the support 90 vertically in the direction of arrow A in FIG. 2A. The wafers 21 are loaded and unloaded through a load lock to allow the beam line to remain evacuated during loading and unloading. The implantation station 16 is pivotal with respect to the beam neutralizer housing 75 by a flexible bellows 100, permitting adjustment of the angle of incidence of the ion beam 14 as the beam impacts wafers 21. A Faraday cage 110 is mounted behind the workpiece support 90 and is used to measure the Faraday ion beam current, $I_f$, which passes through a slot 112 formed in the support 90.

As illustrated in FIGS. 1 and 2A, the control electronics 20 includes implantation or dosage control circuitry 66 that controls ion dosage received by the wafers 21 as well as the implantation depth. The implantation control circuitry 66 receives inputs regarding chamber pressure P from an ion gauge 114 in the chamber 22, and the beam current $I_f$ from the Faraday cage 110. The implantation control circuitry 66 also controls a motor control system 68 for adjusting the angular velocity and the vertical movement of the support 90. For implantation depth control, the implantation control circuitry 66 controls rf control circuitry 19 to adjust the energy of the ion beam 14. The illustrated implantation system 10 is exemplary in nature, and it is noted that the various aspects of the invention may be implemented in a number of different systems in which time delay measurements are desired, including but not limited to ion implanters different from the exemplary system 10, as well as in non-ion implantation apparatus or systems. In this regard, it is noted that the invention may be implemented in association with ion implantation systems having alternate components, for example, using any appropriate ion source adapted to produce an ion beam along a path, a beamline assembly downstream from the source and defining a passageway through which the ion beam is transported along the path, and an end station (e.g., serial, batch, or other), adapted to support one or more wafers along the path for implantation.

The exemplary implanter 10 comprises a time of flight (TOF) ion beam energy measurement system 200 for measuring an average kinetic energy of an ion included in a selected ion pulse of the beam 14, similar in some respects to that illustrated and described in U.S. Pat. No. 6,137,112. The exemplary time of flight ion beam energy measurement system 200 comprises first and second sensors 210 and 220, respectively, which are located along the beam path and spaced apart from one another by a sensor distance 222, where the second sensor 220 is downstream of the first sensor 210. The first sensor 210 generates a first sensor signal when an ion pulse of the ion beam 14 passes the first sensor 210 and the second sensor 220 generates a second sensor signal when the ion pulse passes the second sensor 220.

In accordance with the present invention, a time delay measurement system 204 is provided in the implanter 10 for measuring a time delay between first and second input signals, which provides a correlator output signal Vo to energy measurement circuitry 202 in the control electronics 20. The measurement circuitry 202 derives a time delay measurement according to the correlator output Vo and determines a velocity value according to the delay value and the sensor spacing distance 222. The velocity value, in turn, is used by the energy measurement circuitry 202 to determine the beam energy, for example, according to the equation $E=0.5*M*V^2$, wherein M is the mass of the species being implanted. This energy value may then be rendered to an operator via the user console 67 and/or used to adjust the rf control 19, the ion source 12, or other system operating parameter.

Although the exemplary time delay measurement system 204 is illustrated and described herein in the context of a time of flight energy measurement system 200 for the ion implanter 10, the exemplary time delay measurement system 204 and other time delay measurement systems in accordance with the present invention may be employed for measurement of time delays in other applications apart from that illustrated and described herein, and all such implementations are contemplated as falling within the scope of the present invention and the appended claims. In this regard, the appended claims are not limited to the exemplary implementations illustrated and described herein.

Figure 3:
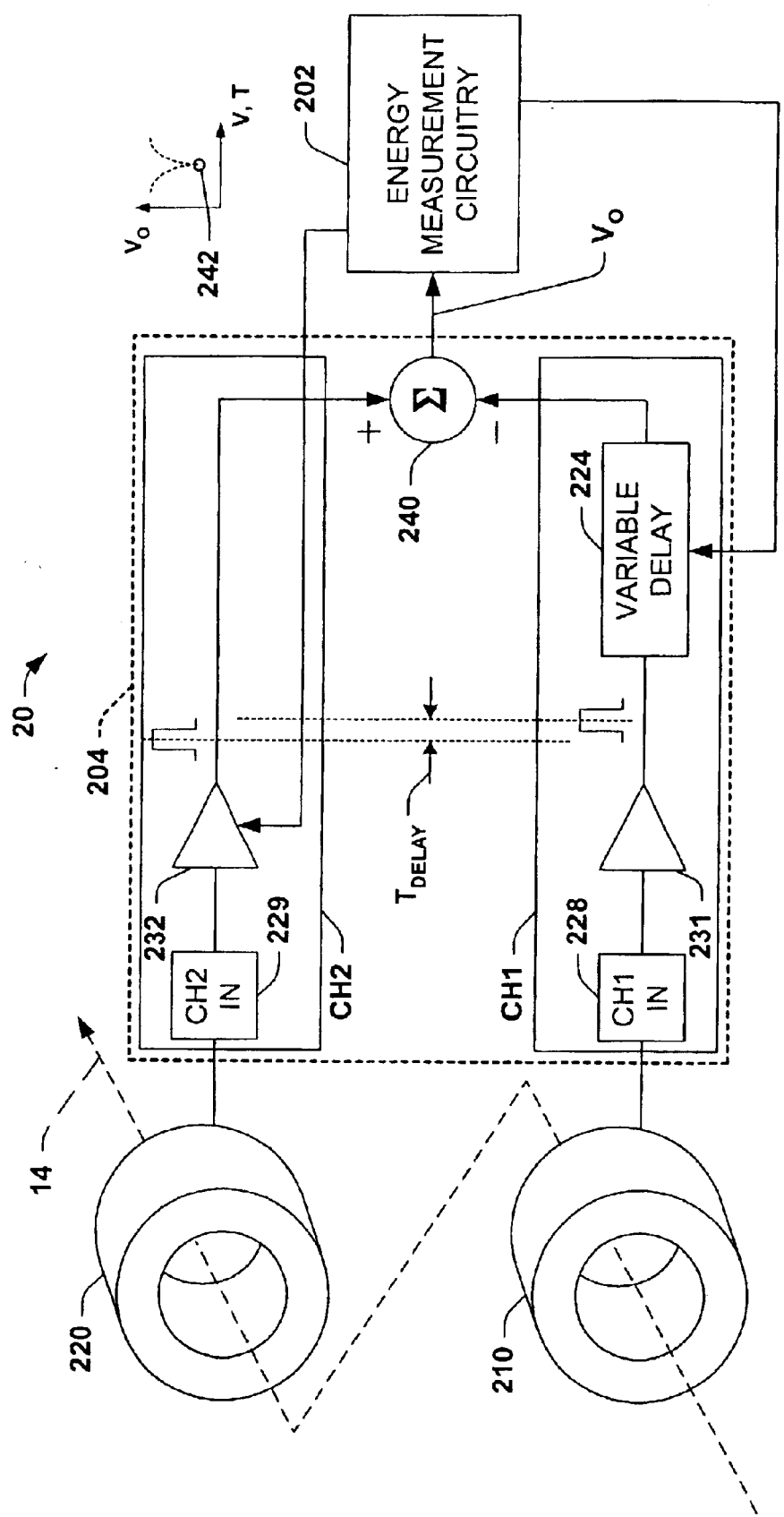
FIG. 3 is a simplified schematic diagram illustrating an exemplary time delay measurement system for measuring a time delay between first and second input signals in the implantation system of FIGS. 1 and 2A in accordance with the invention.

Referring also to FIGS. 3 and 4A–4C, the time delay measurement system 204 is illustrated in FIG. 3 in simplified form, comprising a first channel CH1 receiving the first input signal from the sensor or probe 210 and a second channel CH2 receiving the second input signal from the sensor 220. The first and second input signals are coupled with the channels CH1 and CH2 via input terminals 228 and 229, respectively, and preamplification/signal conditioning is provided by first and second preamps 231 and 232 in the first and second channels CH1 and CH2, respectively. The system 204 also comprises a programmable delay line 224 manufactured by Gigabit under part number PADL-100-X in the first channel CH1 (FIG. 4A), although any delay apparatus may be employed in either of the first and second channels CH1 or CH2 in accordance with the invention to selectively provide a variable or adjustable delay to a signal associated with the corresponding channel. In the illustrated example, the programmable delay line 224 is a circuit component having a 10 bit delay sweep range of 0 to 76.7 ns under control of the energy measurement circuitry 202, although other variable delay apparatus may be employed.

A correlator apparatus 240 is provided in the system 204 having first and second correlator inputs receiving outputs from the first and second channels CH1 and CH2, respectively, as well as a correlator output providing a correlator output signal Vo having an ascertainable correlator output value 242 when the channel outputs are substantially aligned in time. Various correlators 240 are possible, producing an analog output signal Vo that is either a minimum, or a maximum, or other discernable value when the pulses in the two channels are generally coincident in time. In the exemplary system 204, the correlator 240 produces a local minimum or minima at the point of temporal coincidence because this has been found to produce the sharpest discriminant (e.g., the best sensitivity). However, any implementation in which the correlator output provides a distinguishable value or level when the pulses in the two channels coincide in time is contemplated as falling within the scope of the present invention, for example, wherein the ascertainable value is a local maxima or other discernable value indicating substantial temporal alignment of the channel output signals. In operation, the variable delay 224 may be swept or otherwise selectively adjusted while the energy measurement circuitry 202 monitors the correlated output signal Vo, and determines a delay value whereat the ascertainable (e.g., minima) value 242 occurs, thereby indicating that this delay value corresponds to the time delay (e.g., $T_{DELAY}$ in FIG. 3) between the input signals from the probes 210 and 220.

Figure 4A:
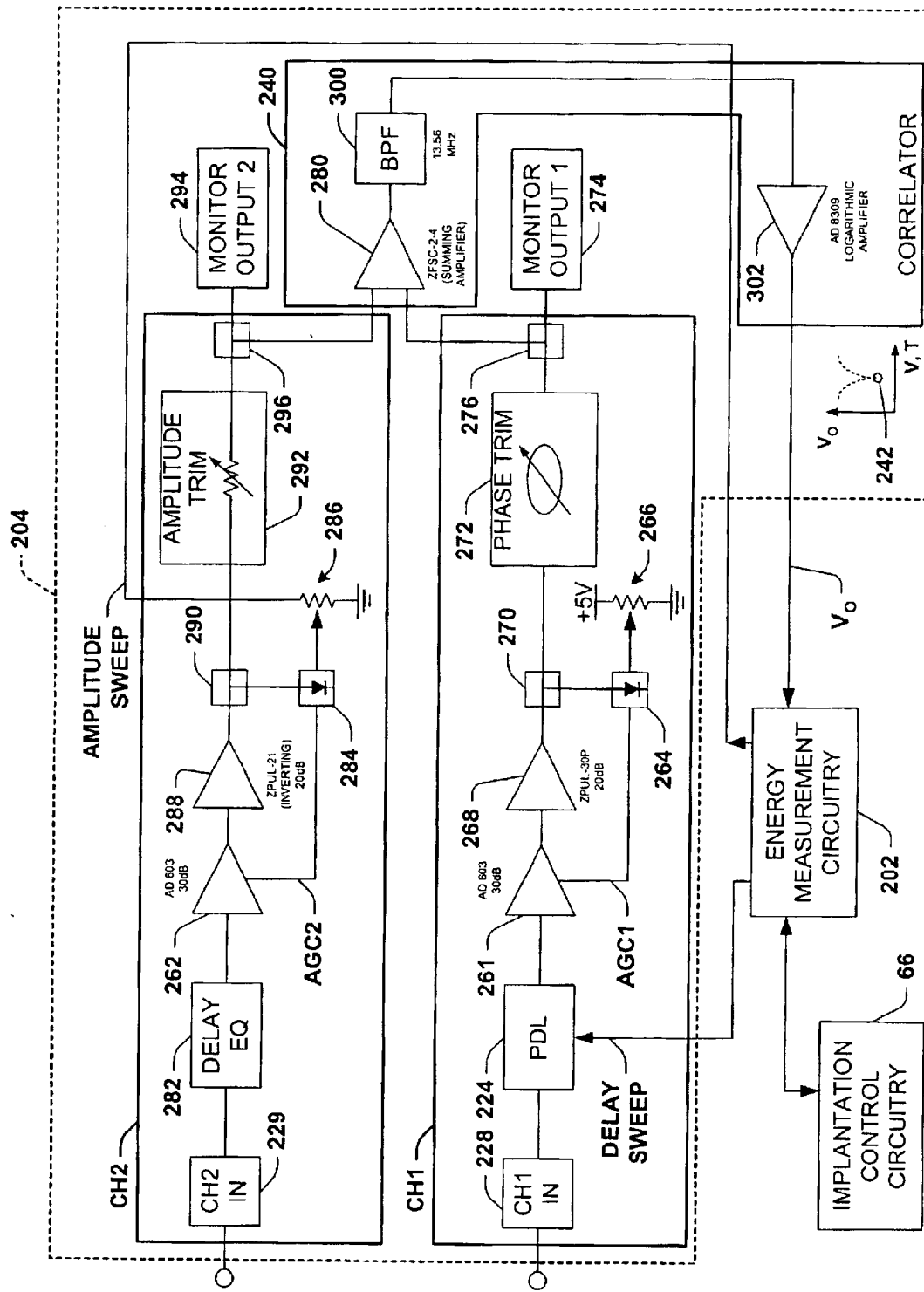
FIG. 4A is a detailed schematic diagram illustrating further details of the exemplary time delay measurement system in the implantation system of FIGS. 1 and 2A.
Figure 4B:
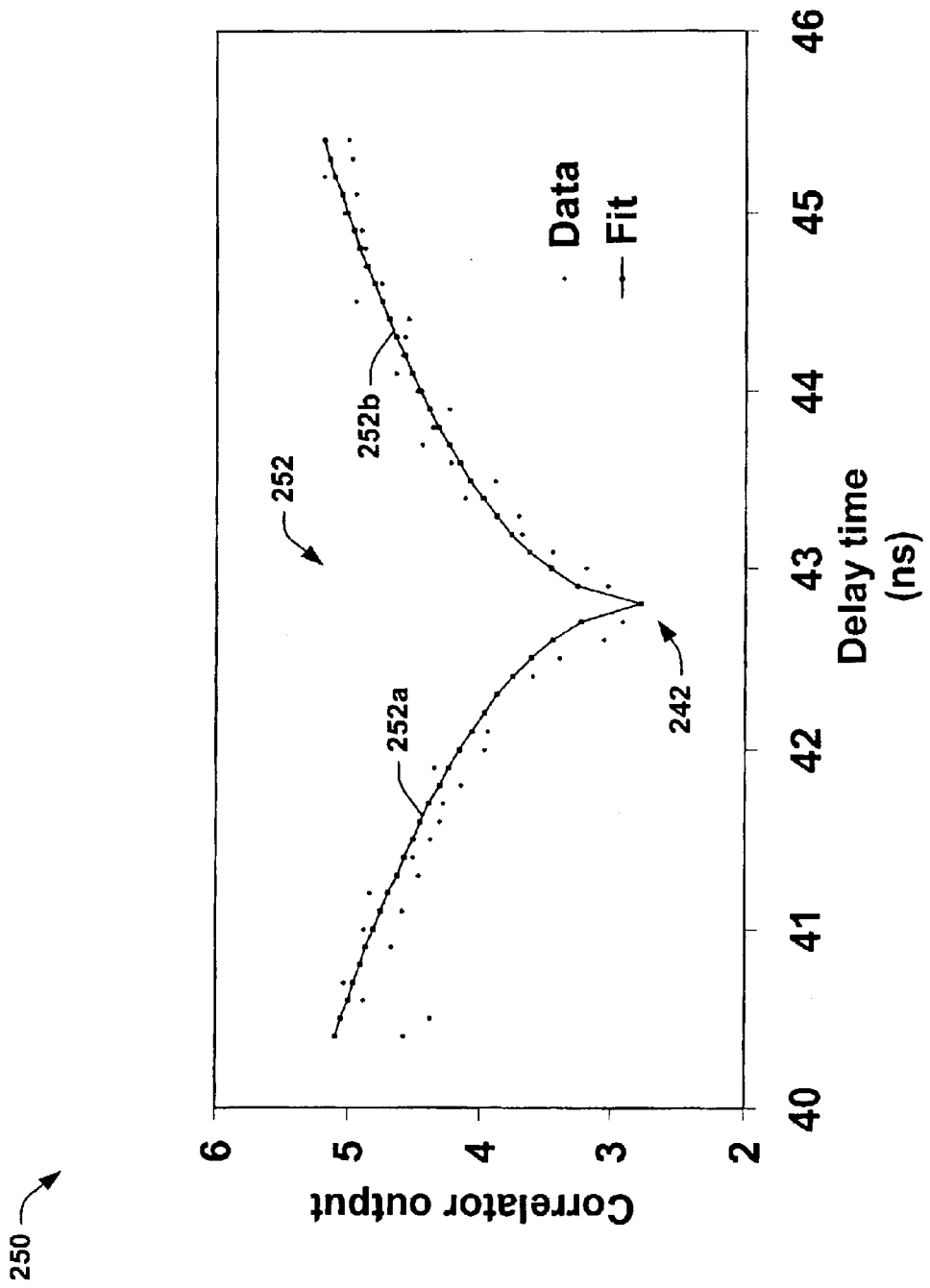
FIG. 4B is a plot illustrating an exemplary correlator output curve for the exemplary time delay measurement system of FIG. 4A.

FIG. 4B illustrates a plot 250 showing an exemplary sweep curve 252 having first and second portions 252a and 252b and a local minima ascertainable value 242 at slightly less than 43 ns, wherein the units along the Y axis (e.g., correlator output Vo) are arbitrary. In the illustrated example of FIG. 4B, the time delay measurement may thus be the value of the programmable delay 224 at which the ascertainable (e.g., minimum) correlator output 242 is achieved. The illustration in FIG. 4B shows an example where the variable delay 224 is selectively adjusted by the measurement circuitry 202 in a sweeping fashion. However, other forms of selective delay adjustment are possible within the scope of the invention, for example, such as Newton's method or any other technique by which the variable delay value corresponding to the ascertainable output value 242 in the correlator output signal Vo is identified by the energy measurement circuitry 202.

Where a single packet or bunch of ions passes through the probes 210 and 220 at a time (e.g., close sensor spacing, where the spacing distance 222 of FIG. 2A is small and/or low beam velocity), this variable delay value may then be used as the measured value of the signal time delay (e.g., $T_{DELAY}$ in FIG. 3), whether taken as a first estimate or subsequently modified using the iterative techniques described below. However, where more than one packet or bunch of ions are concurrently present along the beam path between the probes 210 and 220, the energy measurement circuitry 202 may employ techniques such as those described in U.S. Pat. No. 6,137,112 to determine a number of ion pulses between the sensors, and to determine the measured time delay associated with an individual ion packet traveling from the first probe 210 to the second probe 220, taking into account an estimated or assumed number of intervening packets moving past the second sensor 220 during the time the packet of interest travels between the first and second probes 210 and 220, respectively.

According to another aspect of the invention, the exemplary time delay measurement system 204 further comprises an amplitude adjustment apparatus operable to selectively adjust a gain associated with one of the first and second channels CH1 and CH2. In the simplified depiction of FIG. 3, the amplification gain of the preamp 232 in the second channel CH2 is selectively adjustable by the energy measurement circuitry 202. In the detailed illustration of FIG. 4A, automatic gain control (AGC) amplifiers 261 and 262 are provided in the first and second channels CH1 and CH2, respectively, for example, such as those sold under the part number AD 603 from Analog Devices, Corp. having a gain of 30 dB, or other devices. The first input signal is provided to the programmable delay line 224 via the first input terminal 228 in channel CH1, and the delayed first input signal is provided from the delay apparatus 224 to the AGC amplifier 261. The gain of the amplifier 261 is adjusted according to a gain control signal AGC1 from a feedback element 264 trimmed or set using a variable resistance or potentiometer 266.

The output of the AGC amplifier 261 is provided to a non-inverting amplifier 268 having a gain, for example, of 20 dB, such as those sold as part number ZPUL-30P or others, which provides a non-inverted output to a feedback tap or terminal 270. The tap 270 provides a feedback signal to the element 264 as well as to an optional phase trim component 272. The output of the optional phase trim component 272 is provided to an optional first monitor terminal 274 via a tap 276, as well as to an input terminal of a summing amplifier 280 in the correlator apparatus 240.

In the second channel CH2, the second input signal is provided to a delay equalization component 282 via the second input terminal 229, and then to the AGC amplifier 262, where the gain of the amplifier 262 is adjusted according to a gain control signal AGC2 from a feedback element 284 trimmed or set using a variable resistance or potentiometer 286. The AGC gain is also adjustable according to a signal AMPLITUDE SWEEP provided to the potentiometer 286 from the energy measurement circuitry 202, as illustrated and described further below. The output of the AGC amplifier 262 in channel CH2 is provided to an inverting amplifier 288 having a gain, for example, of 20 dB, such as those sold under part number ZPUL-21 or others, which provides an inverted output to a feedback tap or terminal 290. The inverting amplifier output is thereby provided as a feedback signal to the element 284 as well as to an optional amplitude trim component 292, such as a variable resistance or other trimming apparatus. The output of the optional amplitude trim component 292 is then provided to an optional second monitor terminal 294 via a tap 296, as well as to the other input terminal of the summing amplifier 280 in the correlator apparatus 240.

The purpose of the phase and amplitude trims 274 and 292 is primarily to compensate for delay and amplitude variations introduced by component and assembly tolerances. It is advantageous to balance the system (equal absolute delay and amplitudes in both channels) so that the actual delay difference at the correlator input is close to zero when the CH1 and CH2 channel inputs are fed with signals of zero differential delay. Under these conditions, the noise at the output of the correlator, resulting from the noise associated with the input signal will be a minimum (i.e. noise cancellation). Phase trimming may be accomplished by any known methods using electronic or mechanical means. In one example, the phase trim 272 comprises a section of coaxial line cut to appropriate length (delay is proportional to L). The amplitude trim 292 may comprise a variable attenuator (mechanical or electronic). Alternatively or in combination, amplitude trimming may be accomplished by adjusting the gain of an amplifier (e.g., change in operating point, dc bias). Similarly, this could be achieved by changing the operating point of the AGC amplifiers 261 and/or 262.

The summing amplifier 280 in the illustrated implementation of FIG. 4A provides an output signal representing the sum of the non-inverted delay adjusted first input signal from the first channel CH1 and the inverted and amplitude adjusted second input signal from the second channel CH2. The exemplary system 204 thus provides an inverse summing network (e.g., subtraction), which may be implemented in any appropriate system of components or circuitry in accordance with the invention, for example, such as a balanced transformer, a 1–180 degree signal splitter, a differential amplifier (e.g., op-amp) or the like. In this regard, the subtraction system is preferably linear and broadband to process highly distorted pulses having rise-times as low as a few nanoseconds. Other implementations are possible, wherein the amplifier 288 is non-inverting (e.g., or where both amplifiers 268 and 288 are inverting) and where the amplifier 280 in the correlator apparatus 240 is a difference amplifier, such that the difference between the first and second input signals is obtained with one of the signals being delayed in a controlled fashion and wherein one of the signals may also be amplitude adjustable.

It is noted that the delay adjustment may alternatively be provided in the second channel CH2, that the amplitude adjustment may alternatively be provided in the first channel CH1, and that the amplitude and delay adjustment apparatus may alternatively be provided in the same channel in the time delay measurement system 204. The exemplary correlator apparatus 240 receives the delay adjusted first input signal and the amplitude adjusted and inverted second input signal and sums these to generate a correlator output signal Vo. In the illustrated implementation, the correlator apparatus 240 comprises an optional band pass filter 300 having a pass band centered at 13.56 MHz, which provides a filtered output to an optional logarithmic amplifier component 302, for example, such as those sold as part number AD8308 by Analog Devices, Corp., or others.

The correlator output Vo is provided to the energy measurement circuitry 202 of the control electronics 20 (FIGS. 1 and 2A), which operates to selectively control the delay apparatus 224 and the amplitude adjustment apparatus of the AGC amplifier 262 in the second channel CH2. The delay adjustment in the exemplary implementation is achieved through provision of a DELAY SWEEP signal or digital value from the energy measurement circuitry 202 to the programmable delay line 224, which is a 10 bit digital value in this example. Other implementations are contemplated wherein the DELAY SWEEP control is provided as an analog signal. In the illustrated example, moreover, the delay is adjusted in a sweeping fashion to ascertain a local minima 242 (FIG. 4B) or other ascertainable value in the correlator output signal Vo. However, any adjustment technique may be employed to identify the ascertainable value, for example, such as using Newton's method or other techniques, within the scope of the invention. The exemplary amplitude adjustment is provided by varying a voltage signal AMPLITUDE SWEEP coupled with the upper terminal of the variable resistance component 286 in the second channel CH2, for example, between about 4.5 and 5.0 V in one implementation. This adjustment is also made in sweeping fashion in the illustrated implementation, although any other gain or amplitude adjustment technique is contemplated as falling within the scope of the present invention and the appended claims.

In one possible form of operation, the measurement circuitry 202 controls the delay apparatus 224 to selectively adjust the variable delay in the first channel CH1 while monitoring the correlator output signal Vo, and determines a first delay value corresponding to the ascertainable correlator output value 242 when the outputs from the first and second channels CH1 and CH2 are substantially aligned in time. In the illustrated implementation, substantial temporal alignment is achieved when the inputs to the summing amplifier 280 are approximately the same amplitude and of different (opposite) polarities, at which point the delay value of the programmable delay line 224 (e.g., the value of the signal DELAY SWEEP at which the local minima 242 is found) is within about 1% of the actual time delay between the first and second input signals from the TOF probe sensors 210 and 220. However, the term substantially aligned in time contemplates other measurement accuracies or other predetermined relationships, and all such substantial temporal alignment values are contemplated as falling within the scope of the invention. In this regard, the invention contemplates correlator apparatus providing the ascertainable output value when the delay value of the variable delay is representative of the time delay between the first and second input signals.

In the illustrated implementation, the ascertainable correlator output value 242 indicates substantial temporal alignment of the channel outputs, wherein the current delay value represents the actual time delay between the input signals. However, other implementations are possible within the scope of the present invention, for example, wherein an ascertainable correlator output value is provided when the current delay value is related to the actual time delay between the input signals in other ways. For instance, the correlator output ascertainable value may indicate that the current delay value is a fixed time shorter or longer than the actual time delay between input signals. Other relationships are possible, for example, including non-linear relationships, between the current delay value when the ascertainable output 242 is provided, and the actual time delay being measured, and all such relationships are contemplated as falling within the scope of the invention.

Once a first delay value is thus identified, the value may be used in the measurement circuitry 202 to determine a measured beam velocity, and hence a measured ion beam energy value. Alternatively, one or more iterations of delay and amplitude adjustment may be implemented before determining the velocity and energy of the beam. For instance, the measurement circuitry 202 in the illustrated implementation controls the delay apparatus 224 to adjust the variable delay to the first delay value, controls the amplitude adjustment apparatus via the signal AMPLITUDE SWEEP to selectively adjust the gain in CH2 while monitoring the correlator output signal Vo, and determines a first gain value corresponding to the ascertainable correlator output value 242. The amplitude sweep is accomplished by changing the voltage between about 4.5 to 5.0 volts at the top of the AGC trim resistor 286 in CH2 in FIG. 4A in the exemplary implementation, although any appropriate gain or amplitude adjustment apparatus and techniques may be employed. In this example, the delay 224 is held constant while the value of the signal AMPLITUDE SWEEP is adjusted in a sweeping fashion (or according to any other adjustment technique), by which a curve similar to that of FIG. 4B is obtained at the correlator output Vo. The value of the signal AMPLITUDE SWEEP at which the output Vo is the minimum (e.g., or other ascertainable value) is then used as a first amplitude or gain value in subsequently sweeping the delay apparatus 224 another time.

For instance, with the signal AMPLITUDE SWEEP set at the first gain value, the delay of the apparatus 224 is again swept or adjusted to identify a second delay value at which the ascertainable correlator output value is again obtained. Thus, the measurement circuitry 202 may iterate alternative adjustment (sweeping or otherwise) of the variable delay 224 via the DELAY SWEEP signal and the gain adjustment signal AMPLITUDE SWEEP to determine a delay value corresponding to the ascertainable correlator output value 242 when the outputs from CH1 and CH2 are substantially aligned in time. This iterative process may be repeated any number of times, and may be terminated according to any appropriate criteria. For example, the iteration may be ended when successive delay values are within a certain amount of time of one another (e.g., several ns or any desired accuracy value), or the process may continue for a fixed number of iterations.

Once the temporal shift or delay between two pulse signals is determined in the measurement circuitry 202, the corresponding velocity may be calculated using the known sensor spacing distance 222 (FIG. 2A). Then, the ion beam energy may be determined from the known implantation species mass in the ion implantation system 10. As noted above, the exemplary time delay measurement system 204 and other delay measurement systems in accordance with the invention may also be employed in measuring signal time shifts or delays in applications apart from ion implantation, including but not limited to signal processing, echo sounding, radar, or other situations where time delay measurements are desired.

It is noted that the trim resistors or potentiometers 266 and 286 may be initially set to provide generally similar gains through the channels CH1 and CH2. However, the provision of amplitude adjustment via the signal AMPLITUDE SWEEP in the system 204 facilitates identification of the true time delay between the input signals regardless of the initial channel gain settings. The AGC amplifiers and associated feedback components ensure that the gains are stable in the channels CH1 and CH2, while providing about 40–50 dB dynamic range in the illustrated implementation. During adjustment of the exemplary programmable delay line 224 in FIG. 4A, the delay is adjusted in a generally continuous or sweeping fashion around a target or expected value, wherein a range of only several ns of delay time typically needs to be investigated. For example, as illustrated in the plot 250 of FIG. 4B, for a given species energy and mass and probe sensor spacing 222, the expected time delay may be estimated to be about 43 ns. In this example, the variable delay apparatus 224 is swept or adjusted in the range of about 40 to 46 ns. In the illustrated example, the ascertainable value 242 (e.g., local minima) is found at slightly less than 43 ns. However, it is noted that where a local minima is not found in such a targeted (e.g., localized) sweep, a wider sweep range may be employed.

In this regard, the exemplary programmable delay line 224 is adjustable through a range of about 0 to 76.7 ns, where the period corresponding to the acceleration frequency of 13.56 MHz in the accelerator 18 (FIGS. 1 and 2A) is approximately 73.75 ns. For this case, the adjacent packets are expected to be temporally spaced by about 73.75 ns. In the exemplary ion implantation system 10 for typical implantation species, the delays of interest have been found to be between 0 and about 300 ns, wherein the energy measurement circuitry 202 accounts for the simultaneous presence of multiple ion bunches or packets along the beam path between the sensors 210 and 220 using any appropriate technique, including but not limited to those illustrated and described in U.S. Pat. No. 6,137,112. Other delay apparatus 224 may be employed within the scope of the invention, having any appropriate adjustment range.

The exemplary band pass filter (BPF) 300 in the correlator apparatus 240 has a pass band centered at a frequency of about 13.56 MHz, corresponding to the excitation frequency used in the accelerator 18. This has been found to improve measurement sensitivity and signal to noise ratio (S/N) because it eliminates the other noise in the system 10, although the invention may be carried out without the band pass filter 300. The logarithmic amplifier 302 in the correlator apparatus 240 is advantageously employed so as to amplify a wide dynamic range. In this regard, the dynamic range between the relative minima 242 and the maxima of the curve 252 has been found to be on the order of about 80 or 100 dB, wherein a logarithmic amplifier 302 advantageously captures this range to facilitate identification of the ascertainable value (e.g., local minima) 242 in FIG. 4B. As noted above, the invention contemplates correlator apparatus providing any ascertainable value at the output Vo when the input signals are substantially aligned in time. In the exemplary implementation, the correlator output Vo is a local minima at the ascertainable value 242, which provides a much sharper convergence point in a sweeping or other converging search algorithm. Thus, the point of interest 242 is believed to be easier to distinguish than where the ascertainable value is a local maxima.

Figure 4C:
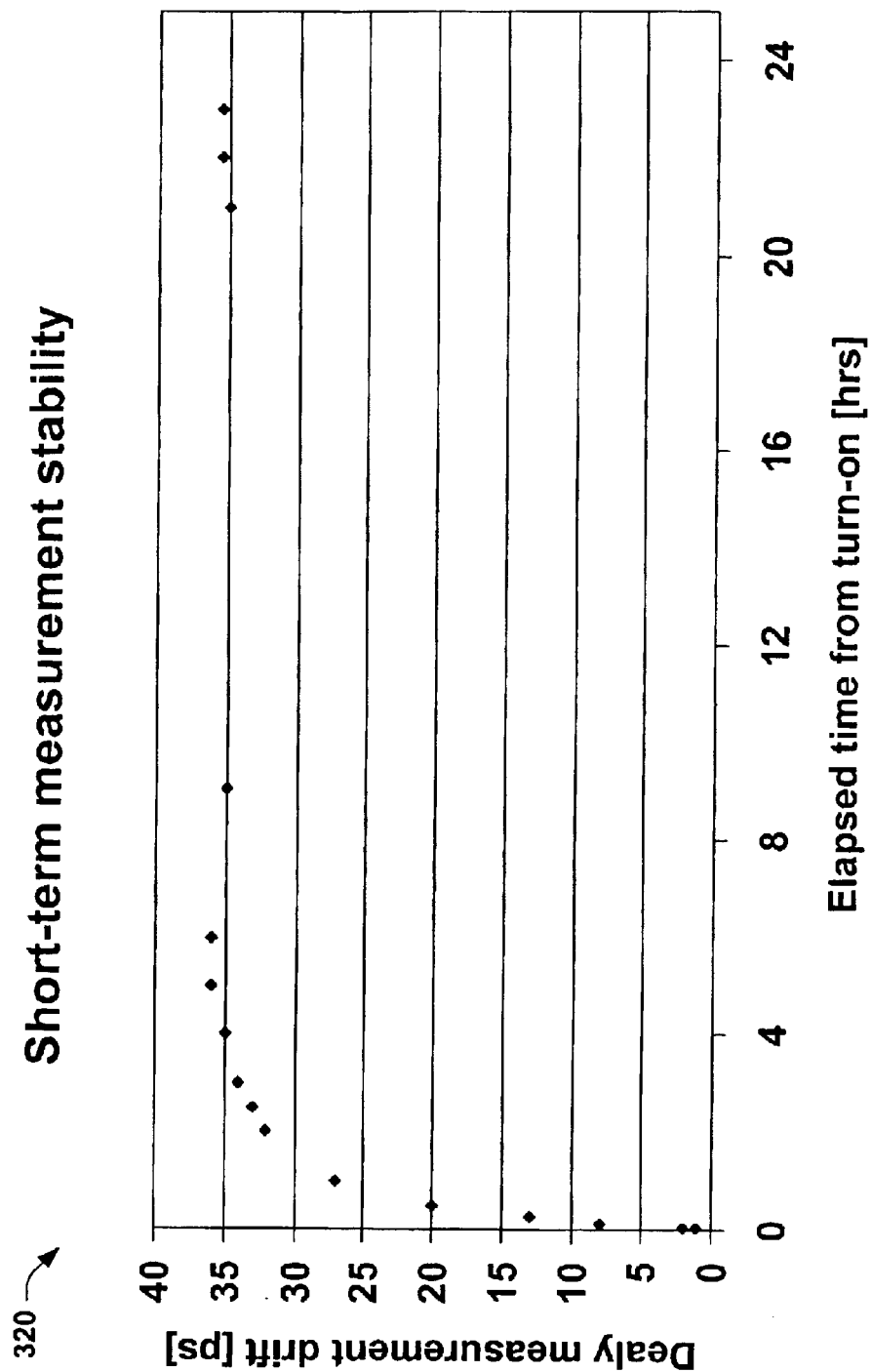
FIG. 4C is a plot illustrating an exemplary delay measurement stability curve for the exemplary time delay measurement system of FIG. 4A.

The TOF system may be calibrated in the ion implanter 10 by providing an ion beam of known average kinetic energy along the path between the probes 210 and 220, and operating the time delay measurement system 204 and the energy measurement circuitry 202 to find the local minima 242, either with or without iteration of alternating amplitude and delay adjustments. The corresponding delay value is used to determine a measured velocity and a measured energy value in keV. The known (e.g., actual) energy and the measured energy may then be subtracted or compared to determine an energy measurement offset value used in subsequent system operation to calibrate the system. It will be appreciated that the above is a single point calibration, wherein multiple point calibration may be employed, together with appropriate curve-fitting or other techniques to provide appropriate adjustment of measured energy values to correspond with the measurement of the known calibration beam energy during calibration operation. This advantageously calibrates out errors in the TOF system, for example, where the center of the coils in the TOF sensors 210 and 220 is mechanically uncertain, and thus the sensor spacing 222 (FIG. 2A) is not known exactly. As discussed further below with respect to FIG. 8, another aspect of the invention provides calibration methodologies for calibrating ion implantation system TOF energy measurement apparatus using modulated DC ion beams. The exemplary system 204 has been found to be fairly stable with time. FIG. 4C provides a plot 320 illustrating short term measurement stability of the exemplary time measurement system 204. The plot 320 illustrates delay measurement drift in ps vs. elapsed time from turn-on (hrs.), wherein it is seen that the system 204 is stable to within less than +/−10 ps within a few hours of cold power up.

Figure 5A:
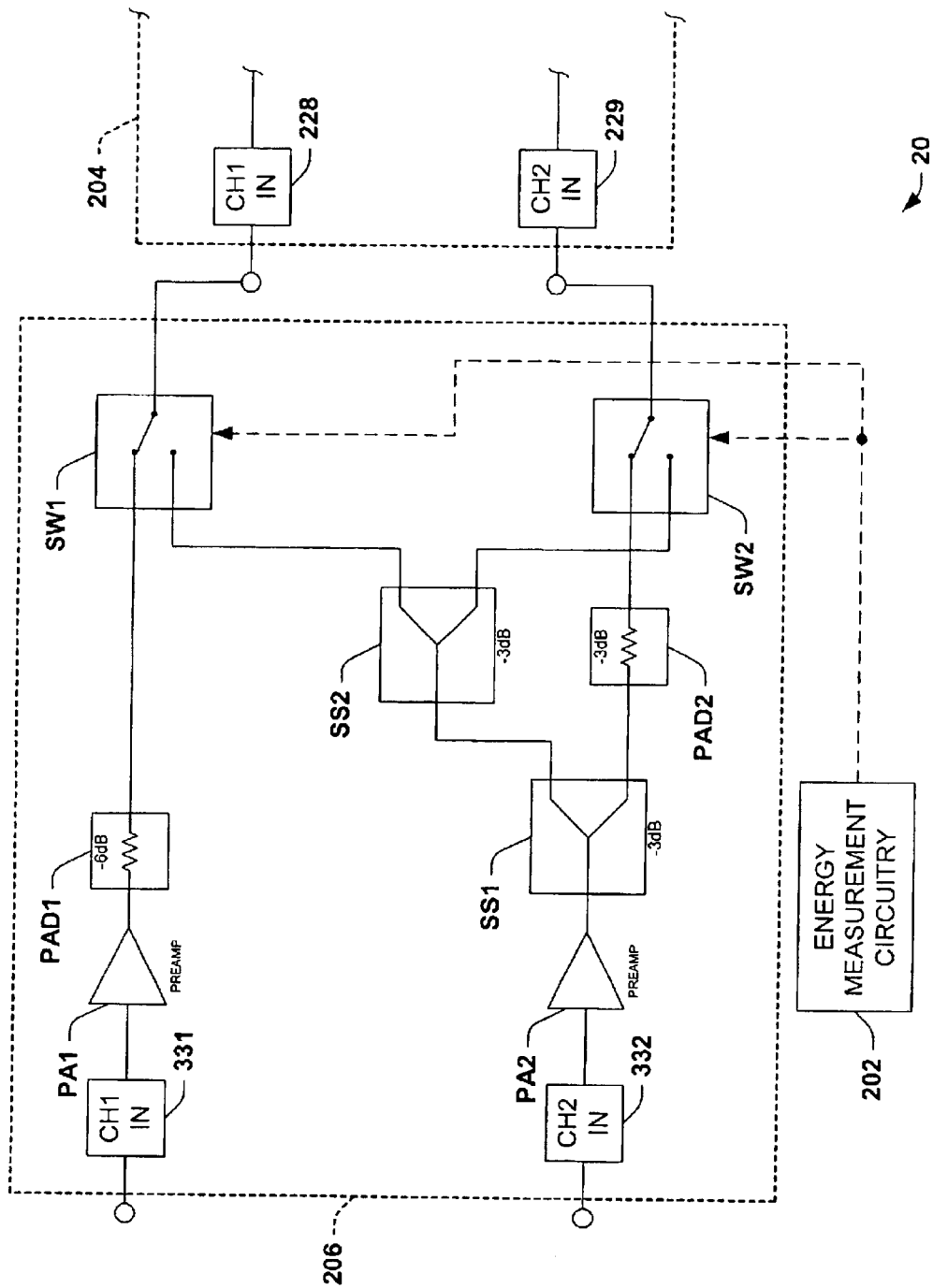
FIG. 5A is a schematic diagram illustrating an exemplary error correction circuit for improving the accuracy of the time delay measurement system of FIG. 4A according to another aspect of the invention.

Referring now to FIGS. 1, 2A, and 5A–5C, another aspect of the invention provides an error correction circuit 206 situated between input signals from the TOF sensors 210 and 220 and the channel CH1 and CH2 inputs to the time delay measurement system 204. During an error correction operation, the circuit 206 provides delay measurement system 204 with substantially equal amplitudes signals of zero relative time delay. This may then be used for correcting errors in the time delay measurement system 204, for example, by aligning or balancing the first and second channels CH1 and CH2 using the phase and/or amplitude trim components 272 and 292, respectively (FIG. 4A). As illustrated in FIG. 5A, the exemplary error correction circuit 206 comprises input terminals 331 and 332 providing the first and second input signals from the sensors 210 and 220 to first and second preamps PA1 and PA2, respectively. A first load element PAD1 having a loading value of −6 dB receives the output of the preamp PA1 and provides the first input signal to a first switching element SW1 coupled with the first input terminal 228 of the time delay measurement system 204.

The second preamp PA2 receives the second input signal via the input terminal, where the output of the preamp PA2 is coupled with a second loading element PAD2 having a loading value of −3 dB through a first signal splitter SS1 also having a loading value of −3 dB. The second loading element PAD2 is coupled with a second switching element SW2, which is also coupled with the second input terminal 229 of the time delay measurement system 204. The first signal splitter SS1 also couples the second input signal from the preamp PA2 to a second signal splitter SS2 having a loading value of −3 dB. Two outputs of the second signal splitter SS2 are coupled with the lower terminals of the switching elements SW1 and SW2.

Under control of the energy measurement circuitry 202, the switching elements SW1 and SW2 operate according to a switching control signal having first and second states corresponding to normal and error correction operation, respectively. In this manner, the energy measurement circuitry may selectively couple the first channel input terminal 228 with the first input signal when the switching control signal is in the first state or couple the first channel input terminal 228 with the second input signal when the switching control signal is in the second state. In normal mode operation (e.g., with the switching elements SW1 and SW2 in the illustrated (first) positions), the first input signal is provided from the sensor 210 to the first channel input terminal 228 through the input terminal 331, the preamp PA1, the first loading element PAD1, and the first switching element SW1. In this mode, the first input signal sees a total loading value of −6 dB from the error correction circuit 206. Also in normal mode operation, the second input signal is provided from the sensor 220 to the second input terminal 229 through the input terminal 332, the preamp PA2, the first signal splitter SS1, the second loading element PAD2, and the second switching element SW2, also having a total loading value of −6 dB. Thus, the error correction circuit 206 provides equal loading values to each of the first and second input signals in normal mode operation.

In error correction mode, the first and second switching elements are switched to the other positions. In this case, the second input signal from the sensor 220 is provided from the input terminal 332 to the first input terminal 228 in the time delay measurement system 204 via the second preamp PA2, the first and second signal splitters SS1 and SS2, and the first switching element SW1, with a total loading value of −6 dB. At the same time, the second input signal is also provided to the second input terminal 229 of the time delay measurement system 204 via the second preamp PA2, the first signal splitter SS1, the second loading element PAD2, and the second switching element SW2, also with a total loading value of −6 dB. In this manner, the first and second channels CH1 and CH2 of the time delay measurement system 204 receive the same signal having substantially equal amplitudes and no relative time delay.

The inventor has appreciated that there is a waveform dependence associated with the time delay measurement, wherein amplitude variances in one or both of the input signals create delay variances in the measurement circuit components. In this regard, the AGC amplifiers 261 and 262 (FIG. 4A) generally have fairly constant internal delays at different gains. This is believed to be because these AGC amplifiers 261 and 262 incorporate an amplifier with a large fixed gain, preceded by a variable attenuator. In this manner, the operating point of the large gain amplifier does not change, and hence the amplifier gain also remains fairly constant. However, to a certain extent, even the AGC amplifiers have a delay vs. gain variation characteristic, which is also seen in other components to a larger extent. In the context of ion implantation system time delay measurements, beam currents in the implanter 10 may vary greatly, such as 3 or 4 orders of magnitude (e.g., 60–80 dB). Moreover, the inventor has appreciated that waveform variations in the input signals cause delay variations in the circuit components. To adjust or balance the delay measurement system 204 with respect to such variations, the exemplary error correction circuitry 206 advantageously provides signals having the same waveform, the same amplitude, and the same phase (e.g., no relative time delay) to both channels of the time delay measurement system 204, by which these waveform and signal level delay relationships can be compensated for in an error correction operation.

Figure 5B:
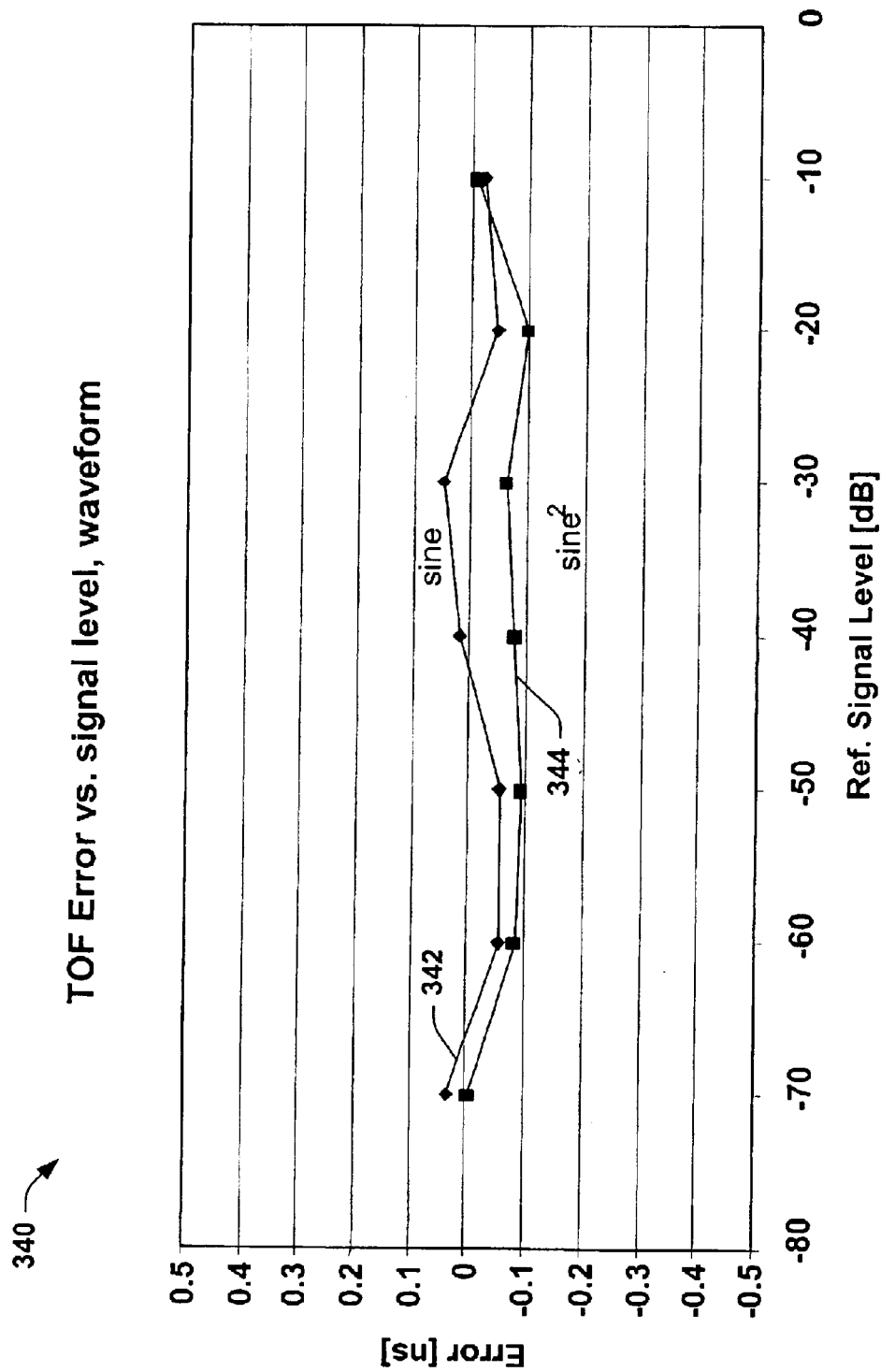
FIG. 5B is a plot illustrating exemplary time delay measurement error vs. signal level curves for different waveforms in the exemplary time delay measurement system, with the error correction scheme of 5A.

FIG. 5B provides a plot 340 illustrating delay measurement error of an error corrected TOF system according to the invention in ns vs. reference signal level for two different signal waveforms 342 (sine) and 344 ($sine^2$). As can be seen, the error correction using the exemplary error correction circuitry 206 provides signal level error variation of less than +/−0.1 ns from −10 dB to −70 dB, along with signal waveform variation between sine and $sine^2$ waveforms of less than about 0.1 ns across the same dynamic range. For the same system operated without such error correction, errors on the order of as much as 0.4 or 0.5 ns are possible. Thus, the error correction circuit 206 may advantageously compliment the other time delay measurement improvements possible using the various aspects of the present invention.

Figure 5C:
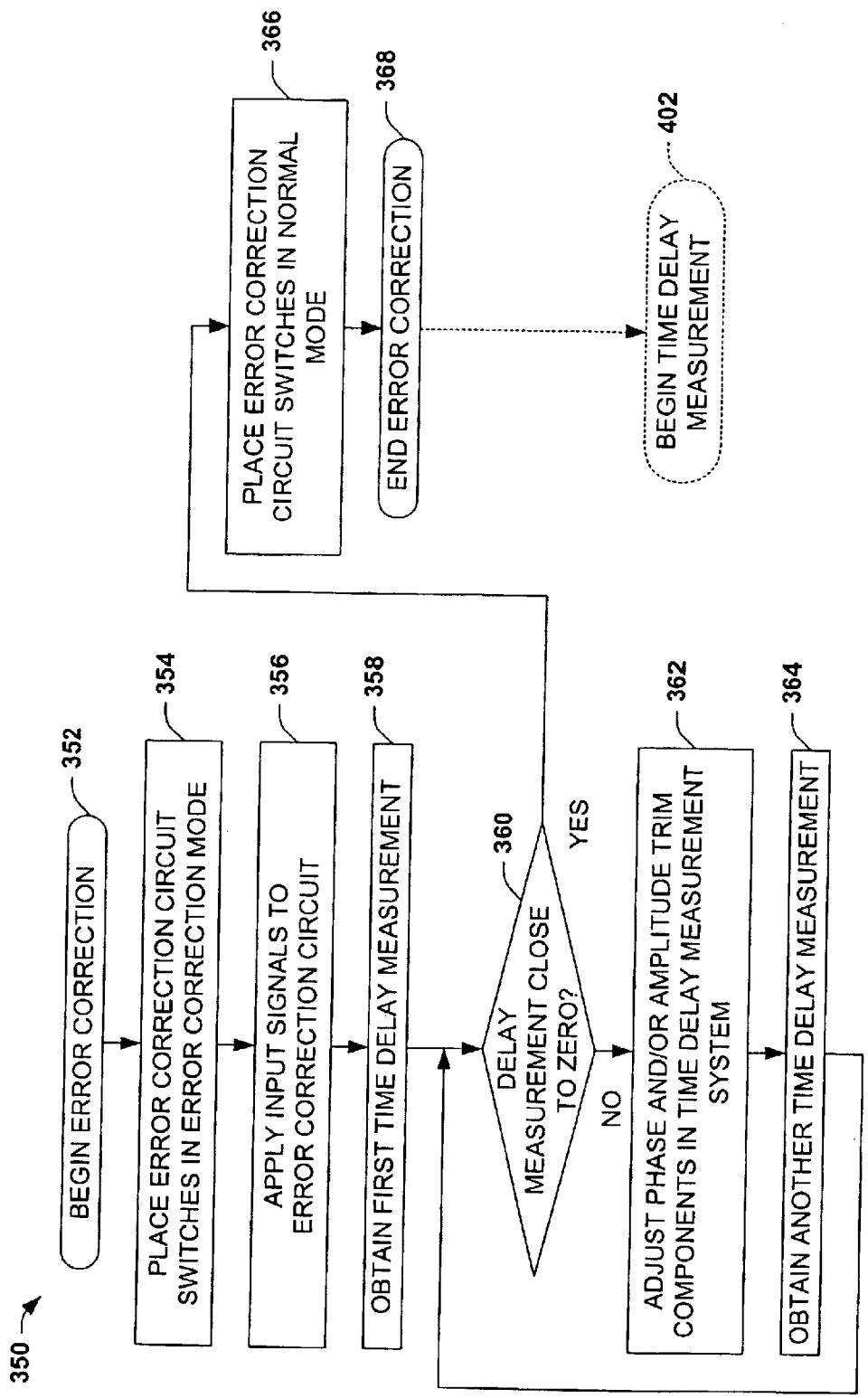
FIG. 5C is a flow diagram illustrating an exemplary method of error correction using the error correction circuit of FIG. 5A in conjunction with the time delay measurement system of FIG. 4A.

FIG. 5C illustrates an exemplary error correction method or operation 350, which may be employed, for example, when the TOF system is started. The error correction is described below in the context of an ion implanter application, although the error correction circuit 204 may be employed in association with any time delay measurement system. Error correction begins at 352, with the switching elements SW1 and SW2 being placed in the second states for error correction mode at 354, for example, via the switching control signal from the energy measurement circuitry 202. At 356, an input signal is applied to at least one input (e.g., 331 and/or 332) of the error correction circuit 206. For example, the implanter 10 may be operated to create an ion beam, wherein the second signal from the sensor 220 is provided to both channels CH1 and CH2 of the time delay measurement system 204 via the error correction circuit 206.

At 358–364, the time delay measurement system 204 is adjusted to provide a zero delay measurement (e.g., by adjustment of various trimming components in the time delay measurement system 204). At 358, a first time delay measurement is obtained with the error correction circuit 206 in error correction mode (e.g., zero delay signals of same amplitude and waveform applied to both channels). Obtaining the time delay measurement at 358 may involve an iterative process, wherein a variable time delay (e.g., the programmable delay line 224 of the system 204 in FIG. 4A) and a channel amplitude (e.g., the AMPLITUDE SWEEP signal in FIG. 4A) are adjusted, as illustrated further below with respect to FIGS. 6 and 7.

If the channels are aligned or balanced, the time delay measurement will ideally be zero. Accordingly, a determination is made at 360 as to whether the delay measurement is close to zero, for example, about 100 ps or less in one implementation. If not (e.g., NO at 360), the system 204 is adjusted at 362, for example, by adjustment of one or both of the phase trim component 272 and the amplitude trim component 292 in FIG. 4A. Residual delays in one or both channels CH1 or CH2 of the system 204 may thus be balanced at 362, for instance, which may be caused by component tolerances, line length tolerances, etc. At 364, another time delay measurement is obtained in similar manner to that obtained at 358, and again a determination is made at 360 as to whether the delay measurement is close to zero. This process at 360, 362, and 364 may be repeated any number of times until the time delay measurement is close to zero. At this point (e.g., YES at 360), the error correction circuit 206 is placed in normal mode at 366, whereafter the error correction operation 350 ends at 368. Following error correction 350, normal time delay measurement may begin, for example, at 402 in the exemplary time delay measurement method 400 discussed hereinafter with respect to FIG. 6.

With the switching elements SW1 and SW2 in the normal operating conditions, any waveform and/or signal level variations will be taken into account. In another example, no trimming is performed, and instead the delay value during error correction is read and subsequent measurements during normal operations are offset accordingly by the measurement circuitry 202. Thus, the error correction circuit 206 may be designed such that the system 204 receives the same signal levels and waveshapes as present during the actual measurement, but with essentially zero differential delay, and equal amplitudes and waveforms. This zero delay condition is provided by the passive, 0-degree signal splitters SS1 and SS2, for example, in conjunction with coax lines of substantially equal length. Hence, any deviation from zero delay detected during this first error correction measurement may be attributed to the processing electronics.

Figure 6:
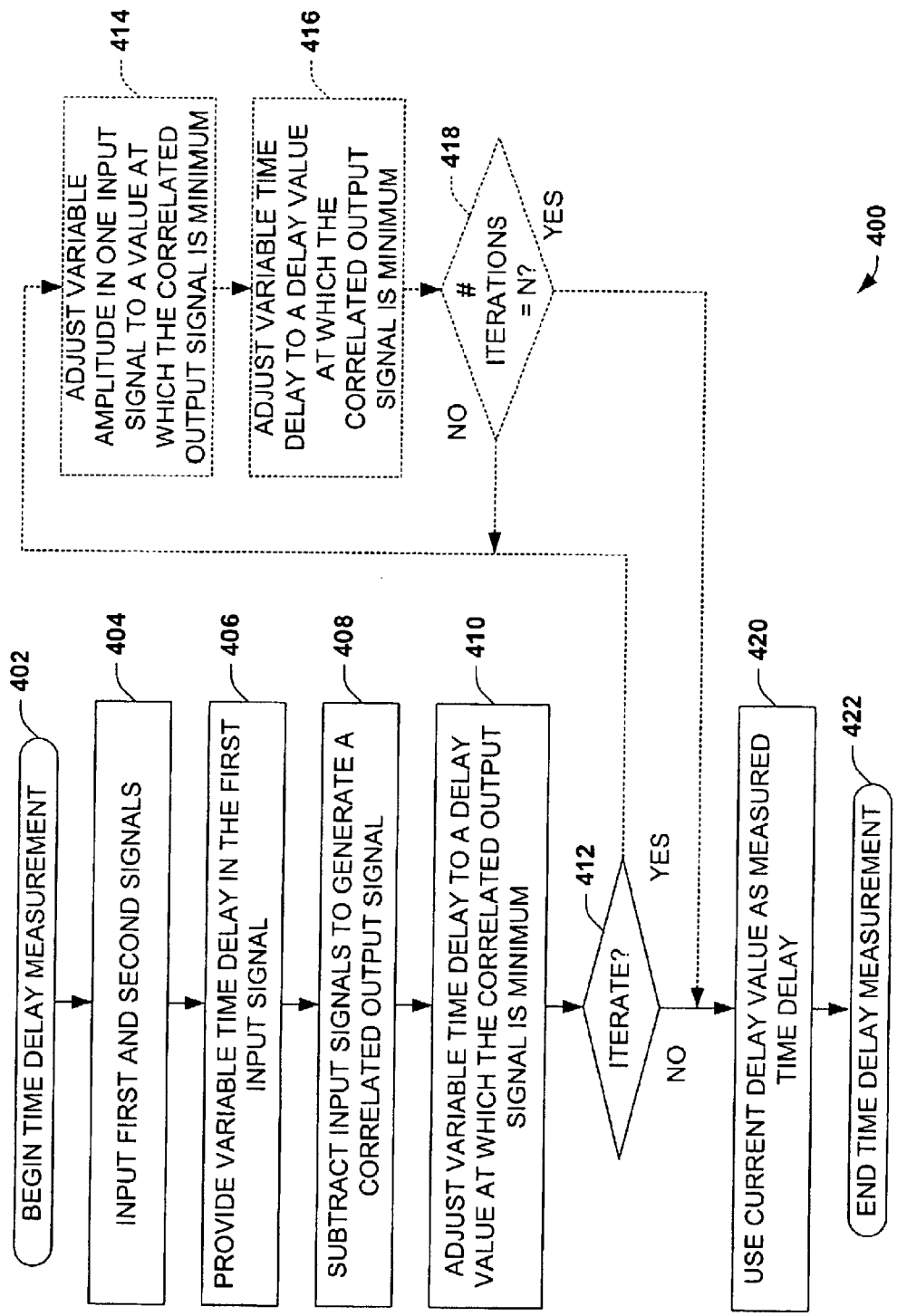
FIG. 6 is a flow diagram illustrating an exemplary method of measuring a time delay between first and second input signals in accordance with another aspect of the invention.

Referring now to FIG. 6, another aspect of the invention provides techniques for measuring a time delay between first and second input signals, which may be employed in measurement of time delays in ion implantation systems, particle accelerators, test equipment, signal processing, echo sounding, or other applications wherein measurement of time delays is desired. An exemplary method 400 is illustrated in the flow diagram of FIG. 6 in accordance with this aspect of the invention. Although the exemplary method 400, and other methods according to the invention, are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the systems and apparatus illustrated and described herein as well as in association with other devices not illustrated.

The methods, including the exemplary method 400, according to this aspect of the invention comprise providing a variable time delay in one of the input signals, correlating the input signals, such as through subtraction, to generate a correlated output signal, adjusting the variable time delay to a value at which the correlated output signal is an ascertainable value when the input signals are substantially aligned in time, and determining a measured time delay according to the delay value at which the correlated output signal is the ascertainable value. The methods may further comprise adjusting a variable amplitude in one of the input signals to a value at which the correlated output signal is a minimum, and again adjusting the variable time delay to a delay value at which the correlated output signal is an ascertainable value when the input signals are temporally aligned, before determining the measured time delay.

Beginning at 402, the method 400 comprises inputting first and second signals at 404 and providing a variable time delay in one of the first and second input signals at 406 (e.g., the first input signal is delayed in this example). The signals are then correlated, for example, by subtracting the time delayed first input signal and the second input signal to generate a correlated output signal at 408. The correlation at 408 may involve other correlation techniques beside subtraction within the scope of the invention. For instance, as illustrated in FIG. 4A, one of the input signals may be inverted prior to the correlation apparatus 240 (e.g., by the inverting amplifier 288 in the second channel CH2), with the correlation apparatus 240 performing a summation. In this regard, any appropriate correlation techniques may be employed in implementing the correlation of the invention to generate a correlated output signal having an ascertainable value indicating substantial temporal alignment of the signals, including other techniques not illustrated or described herein, wherein all such correlations are contemplated as falling within the scope of the present invention and the appended claims.

The variable delay is then adjusted at 410 to a delay value at which the correlated output signal is an ascertainable value when the time delayed one of the first and second input signals and the other of the first and second input signals are substantially aligned in time. The adjustment at 410 may be a sweep as illustrated and described above, or may be performed according to any appropriate technique or algorithm to identify the delay value at which the input signals are temporally aligned. For example, in the exemplary time delay measurement system 204 above (FIG. 4A), the delay 224 is adjusted until the correlator output Vo reaches an ascertainable value (e.g., local minima) at which the signals at the taps 276 and 296 are substantially aligned in time. In this regard, the ascertainable value used for determining the delay value may be any discernable value, including but not limited to a local minima, a local maxima, or other value indicating substantial temporal alignment of the signals.

As indicated above, this delay value may then be used as the measurement value, or alternatively, one or more iterations of alternating amplitude (e.g., gain) adjustments and delay adjustments may be performed to refine the delay measurement value. The illustrated method 400 exemplifies this aspect of the invention, wherein following the delay adjustment at 410, a determination is made at 412 as to whether iteration is desired. If not (e.g., NO at 412), a measured time delay is determined at 420 according to the current delay value obtained at 410, before the method 400 ends at 422. Where iteration is employed (e.g., YES at 412), the method proceeds to 414 where a variable amplitude in one of the input signals is adjusted to a value at which the correlated output signal is minimum, with the delay value remaining at the value determined at 410. At 416, the variable time delay is again adjusted to a delay value at which the correlated output signal is minimum. This iteration may be continued at 414 and 416 any number of times, where a determination is made at 418 as to whether an integer number N iterations have been performed. If not (e.g., NO at 418), further amplitude and delay adjustments are performed at 414 and 416, respectively. Once the desired number of iterations are performed (e.g., YES at 418), the method 400 proceeds to 420 where the latest delay value is used as the measured time delay, and the method 400 ends at 422.

Figure 7:
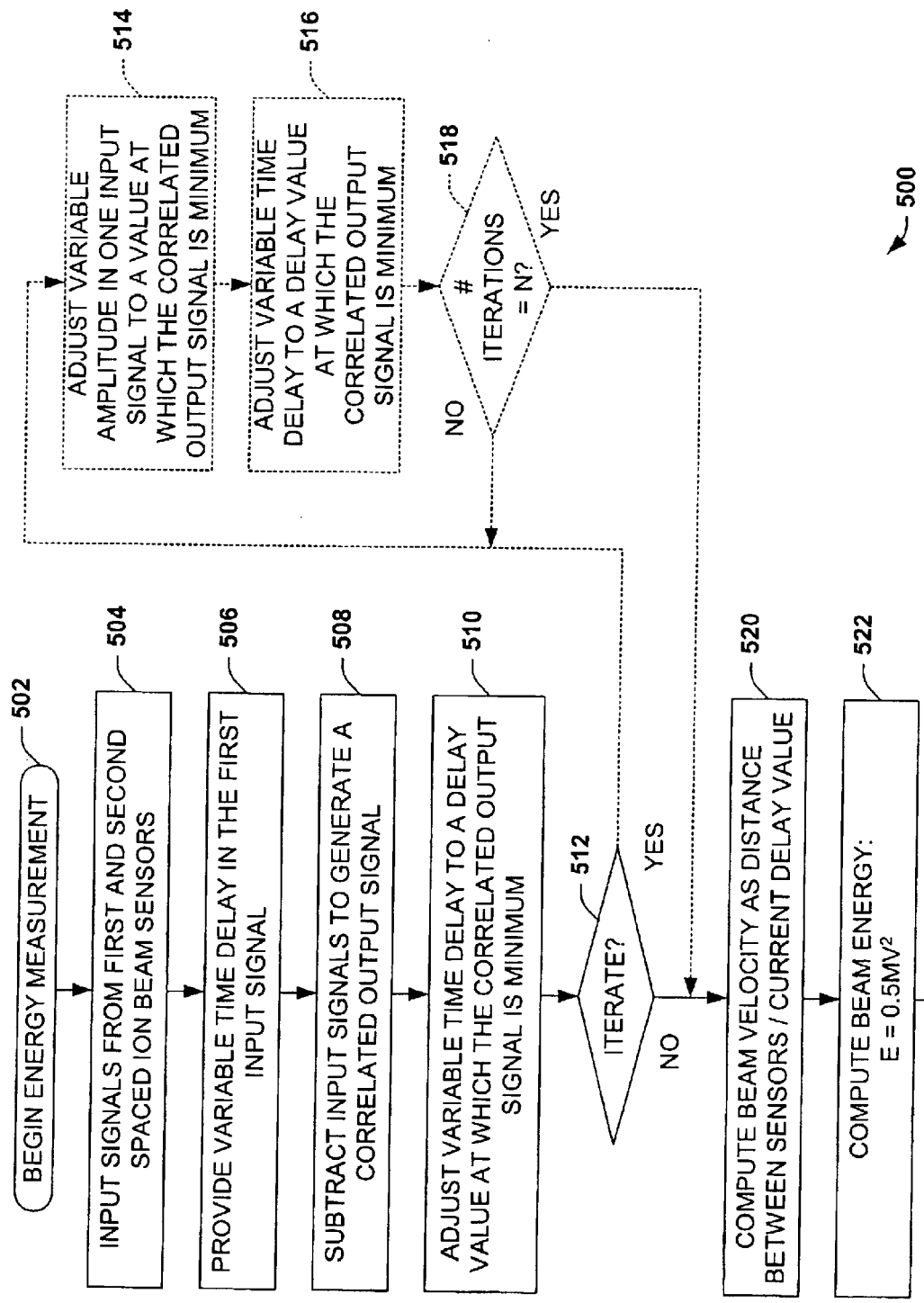
FIG. 7 is a flow diagram illustrating an exemplary method of measuring ion beam energy in an ion implantation system according to yet another aspect of the invention.

Referring now to FIG. 7, according to another aspect of the invention, the time delay measurement techniques discussed above may be employed in the context of measuring an average kinetic energy of particles in an ion beam. An exemplary method 500 is illustrated according to this aspect of the invention, beginning at 502. At 504, first and second signals are input from first and second spaced ion beam sensors in an ion implantation system or other system in which ion beam energy is to be measured. A variable time delay is provided at 506 in one of the first and second input signals (e.g., in the first signal in the illustrated example). At 508, the time delayed signal and the other signal are correlated, using subtraction or other correlation techniques to generate or provide a correlated output signal. The variable time delay is adjusted at 510 to a delay value at which the correlated output signal is minimum (e.g., or any other ascertainable value at which the signals are substantially aligned in time).

At 512, a determination is made as to whether or not iteration is desired. If not (e.g., NO at 512), the ion beam velocity is determined at 520 according to the current delay value and according to a distance between the sensors (e.g., distance 222 in FIG. 2A), for example, according to the equation $V=D/T_{DELAY}$. Thereafter at 522, the beam energy is computed according to the measured beam velocity and a mass of particles in the ion beam, for example, using the equation $E=0/5*M*V^2$, before the method 500 ends at 524. Alternatively, as in the above method 400, iteration may be desired at 512 for further refinement of the time delay measurement before computation of the velocity and beam energy. In this case (e.g., YES at 512), the method 500 proceeds to 514 where a variable amplitude in one of the input signals (e.g., in the second channel CH2 in FIG. 4A) is adjusted to a value at which the correlated output signal is minimum, with the delay value remaining at the value determined at 510. At 516, the variable time delay is again adjusted to a delay value at which the correlated output signal is minimum. A determination is then made at 518 as to whether an integer number N iterations have been performed. If not (e.g., NO at 518), further amplitude and delay adjustments are performed at 514 and 516, respectively. Once the desired number of iterations are performed (e.g., YES at 518), the latest delay value is used in computation of the beam velocity at 520 and the beam energy is computed at 522 before the method 500 ends at 522.

Figure 8:
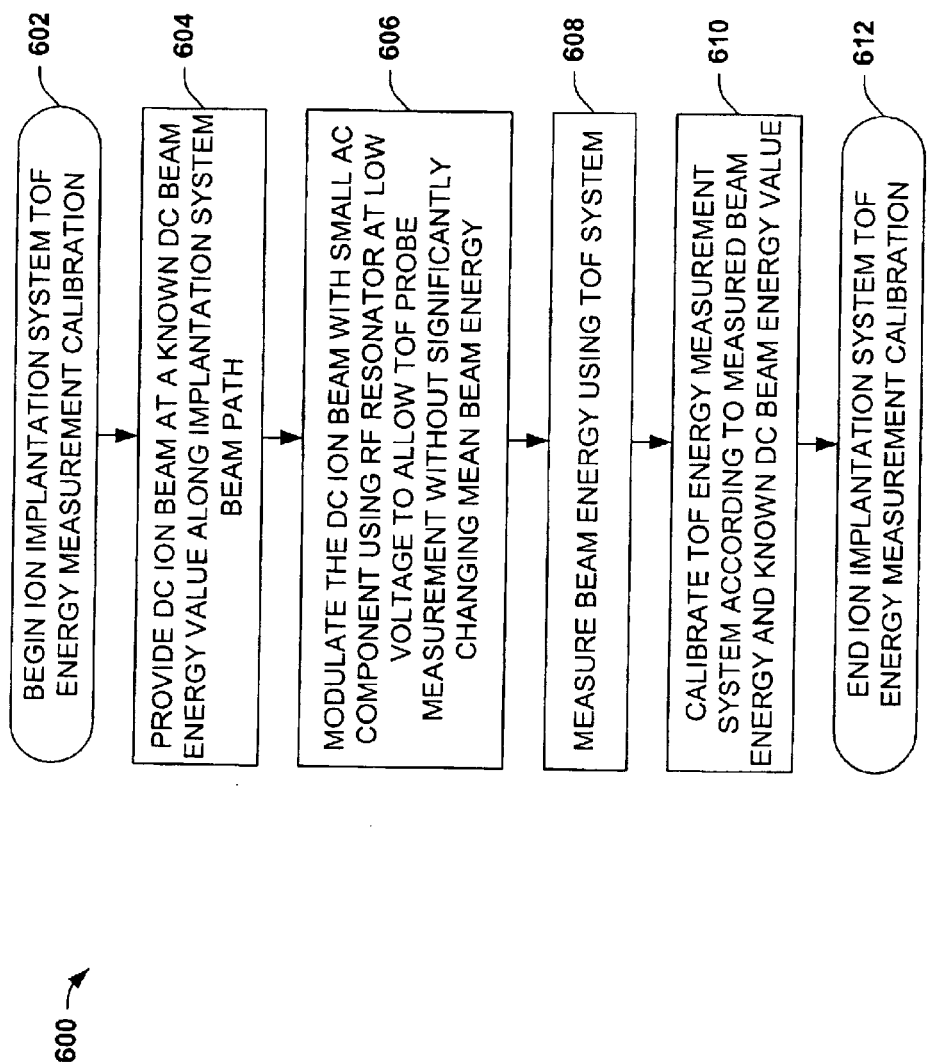
FIG. 8 is a flow diagram illustrating an exemplary method of ion implantation system TOF energy measurement calibration in accordance with another aspect of the invention.

Referring now to FIGS. 1, 2A, and 8, yet another aspect of the present invention provides techniques for calibrating an energy measurement system in an ion implantation system, such as the TOF system 200 illustrated and described above. This aspect of the invention is exemplified in a method 600 illustrated in FIG. 8 and described hereinafter. Beginning at 602, the exemplary method 600 comprises providing a DC ion beam at a known DC beam energy along a beam path in the ion implantation system at 604. In one example, extraction electrodes of the ion source 12 in the implantation system 10 of FIGS. 1 and 2A may be energized with a known DC extraction voltage, from which the DC beam energy can be determined using known techniques. The DC beam is then modulated with a small AC component at 606, for example, by energizing an rf resonator in the linear accelerator 18 at low voltage, or by any appropriate AC modulation techniques. Any such AC modulation techniques may be employed at 606 by which the probes 210 and 220 in FIG. 1 are able to provide sensor signals to the TOF system in the control electronics 20 without significantly changing the mean or average beam DC energy level. In one example, this involves energizing an rf accelerator so as to bunch or packetize ions in the beam without net acceleration thereof.

At 608, a beam energy is measured using the time of flight energy measurement system, for example using the techniques illustrated and described above with respect to FIG. 7. At 610, the time of flight energy measurement system is calibrated according to the measured beam energy and the known DC beam energy, and the method 600 ends at 612. The calibration may comprise, for example, computing an energy offset value at 610 according to the measured beam energy and the known DC beam energy. Using a generally DC beam has the advantage that the energy of the beam ions is easily correlated to the ion source extraction voltage, where the DC energy in keV is ascertainable to within 1% or better. However, as a purely DC ion beam will not provide sensor signals in inductive or capacitive sensor probes, such as probes 210 and 220 in FIGS. 1 and 2A, the invention provides for moderate AC excitation, for example, using accelerator resonators operated at low voltages. This may be done at small AC levels to facilitate probe sensor measurement of the beam without appreciably changing the average ion beam energy. At such AC modulation levels, TOF system measurements can be made and the measured energy value can be compared with the actual known DC energy value to determine a calibration offset value. In this manner, the invention provides for calibration of the end station probes 210 and 220 according to the DC reading from the source extraction.

Initial calibration against a known standard is preferred because it may be difficult to relate the mechanical probe separation distance 222 in FIG. 2A to an "effective" electrical distance. This is due in part to the difficulty of determining the mechanical position of the coil within the housing of the probe sensors 210 and/or 220 after potting. In addition, electrical and mechanical centers of the probes may differ as a result of field asymmetries within the probe coil/shield assembly. The initial TOF calibration operates to determine a "correct" probe distance 222 by selecting a value that produces the best fit with known, accurate energy readings on the tool. These calibration points may be obtained, for example, using the DC beam modulation techniques illustrated in FIG. 8, and/or from nuclear reaction measurements, or incorporation of narrow slits for improved FEM accuracy.

Additional calibration steps may be executed prior to individual TOF measurements to remove any uncertainty introduced by the measurement system itself. These may include changes of mechanical components (e.g., geometry), and errors introduced by the electronics 20. One approach provides a separate calibration port on the probes 210 and 220, allowing injection of a calibration signal to simulate the beam current. In the calibration mode, these two ports may be driven by a signal with zero differential delay, such as obtained by splitting the 13.56 MHz signal from the master oscillator and using matched (e.g., equal-length) feed lines, or by using the error correction circuit 206 illustrated and described above. Any delay deviations from zero may thus be attributed to system-introduced errors, which can then be employed to correct the actual measurement. This approach has been found to work as intended, but adds complexity to the probe assembly and may require a "beam-off" condition during the calibration step. In addition, this approach does not allow for correction of waveform and signal level dependent delay errors. To address signal level dependent delay errors, a look-up table may be implemented in software in the control electronics 20. By storing the delay error as a function of signal level (e.g., available as a log amp output), it is possible to remove most of this error. Alternatively, the above mentioned error correction/error correction circuitry and methods (e.g., FIG. 5A above) may be employed to account for these types of effects.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A time delay measurement system for measuring a time delay between first and second input signals, comprising:
   a first channel receiving the first input signal;
   a second channel receiving the second input signal;
   a delay apparatus associated with one of the first and second channels, the delay apparatus being operable to selectively provide a variable delay to an input signal associated with the one of the first and second channels; and
   a correlator apparatus having first and second correlator inputs receiving outputs from the first and second channels, respectively, and a correlator output providing a correlator output signal having an ascertainable correlator output value when a delay value of the variable delay is representative of the time delay between the first and second input signals.

2. The time delay measurement system of claim 1, wherein the correlator provides a minimum output value when the outputs from the first and second channels are substantially aligned in time.

3. The time delay measurement system of claim 1, further comprising an amplitude adjustment apparatus operable to selectively adjust a gain associated with one of the first and second channels.

4. The time delay measurement system of claim 3, further comprising measurement circuitry receiving the correlator output signal, the measurement circuitry being adapted to selectively control the delay apparatus and the amplitude adjustment apparatus.

5. The time delay measurement system of claim 4, wherein the measurement circuitry controls the delay apparatus to selectively adjust the variable delay while monitoring the correlator output signal and determines a first delay value corresponding to the ascertainable correlator output value when the outputs from the first and second channels are substantially aligned in time.

6. The time delay measurement system of claim 5, wherein the correlator provides a minimum output value when the outputs from the first and second channels are substantially aligned in time, and wherein the measurement circuitry determines the first delay value corresponding to the minimum output value.

7. The time delay measurement system of claim 5, wherein the measurement circuitry controls the delay apparatus to adjust the variable delay to the first delay value, controls the amplitude adjustment apparatus to selectively adjust the gain while monitoring the correlator output signal, and determines a first gain value corresponding to the ascertainable correlator output value.

8. The time delay measurement system of claim 7, wherein the measurement circuitry alternatively iterates adjustment of the variable delay and the gain to determine a delay value corresponding to the ascertainable correlator output value when the outputs from the first and second channels are substantially aligned in time.

9. The time delay measurement system of claim 8, wherein the correlator provides a minimum output value when the outputs from the first and second channels are substantially aligned in time, and wherein the measurement circuitry determines the first delay value corresponding to the minimum output value.

10. The time delay measurement system of claim 3, wherein the delay apparatus is associated with the first channel and is operable to selectively provide the variable delay to the first input signal in the first channel, and wherein the amplitude adjustment apparatus is operable to selectively adjust a gain associated with the second channel.

11. The time delay measurement system of claim 1, further comprising measurement circuitry receiving the correlator output signal, the measurement circuitry being adapted to control the delay apparatus to selectively adjust the variable delay while monitoring the correlator output signal and to determine a delay value corresponding to the ascertainable correlator output value when the outputs from the first and second channels are substantially aligned in time.

12. The time delay measurement system of claim 1, further comprising an error correction circuit disposed between the first input signal and the first channel and between the second input signal and the second channel, the error correction circuit comprising a first switching element operable according to a switching control signal having first and second states, wherein the first switching element is adapted to selectively couple the first channel with the first input signal when the switching control signal is in the first state and to couple the first channel with the second input signal when the switching control signal is in the second state.

13. The time delay measurement system of claim 12, wherein the error correction circuit further comprises a second switching element operable according to the switching control signal, first and second signal splitters individually having a first loading value, and first and second load elements, the first loading element having a second loading value approximately twice the first loading value and being coupled between the first input signal and the first switching element, the second loading element having the first loading value, the first signal splitter and the second loading element being coupled between the second input signal and the second switching element, the second signal splitter being coupled between the first signal splitter and the first switching element;

wherein the first switching element is adapted to selectively couple the first channel with the first input signal through the first loading element when the switching control signal is in the first state and to couple the first channel with the second input signal through the first and second signal splitters when the switching control signal is in the second state;

wherein the second switching element is adapted to selectively couple the second channel with the second input signal through the first signal splitter and the second loading element when the switching control signal is in the first state and to couple the second channel with the second input signal through the first and second signal splitters when the switching control signal is in the second state; and wherein the second input signal is provided to the first and second channels when the switching control signal is in the second state having substantially equal amplitudes and no relative time delay.

14. A time of flight ion beam energy measurement system for measuring an average kinetic energy of an ion included in a selected ion pulse of an ion beam of an ion beam implanter, the time of flight ion beam energy measurement system comprising:

first and second sensors spaced apart from one another by a sensor distance along an ion beam path, the second sensor being downstream of the first sensor, the first sensor generating a first sensor signal when an ion pulse of the ion beam passes the first sensor and the second sensor generating a second sensor signal when the ion pulse passes the second sensor;

a time delay measurement system for measuring a time delay between the first and second sensor signals, comprising:
  a first channel receiving the first sensor signal;
  a second channel receiving the second sensor signal;
  a delay apparatus associated with one of the first and second channels, the delay apparatus being operable to selectively provide a vanable delay to a sensor signal associated with the one of the first and second channels; and
  a correlator apparatus having first and second correlator inputs receiving outputs from the first and second channels, respectively, and a correlator output providing a correlator output signal having an ascertainable correlator output value when a delay value of the variable delay is representative of the time delay between the first and second input signals; and measurement circuitry receiving the correlator output signal, the measurement circuitry being adapted to control the delay apparatus to selectively adjust the variable delay while monitoring the correlator output signal, to determine a first delay value corresponding to the ascertainable correlator output value when the delay value of the variable delay is representative of the time delay between the first and second input signals, and to determine a measured ion beam energy according to the first delay value, a mass of particles in the ion beam, and the sensor distance.

15. The time of flight ion beam energy measurement system of claim 14, wherein the correlator provides a minimum output value when the outputs from the first and second channels are substantially aligned in time.

16. The time of flight ion beam energy measurement system of claim 14, wherein the time delay measurement system further comprises an amplitude adjustment apparatus operable to selectively adjust a gain associated with one of the first and second channels, wherein the measurement circuitry is adapted to:

control the delay apparatus to adjust the variable delay to the first delay value, control the amplitude adjustment apparatus to selectively adjust the gain while monitoring the correlator output signal, determine a first gain value corresponding to the ascertainable correlator output value, control the amplitude adjustment apparatus to adjust the gain to the first gain value, control the delay apparatus to again selectively adjust the variable delay while monitoring the correlator output signal, determine a second delay value corresponding to the ascertainable correlator output value when the outputs from the first and second channels are substantially aligned in time, and determine a measured ion beam energy according to the second delay value, the mass of particles in the ion beam, and the sensor distance.

17. An ion implantation system, comprising:

an ion source adapted to produce an ion beam along a path;

a beamline assembly located downstream from the ion source and defining a passageway through which the ion beam is transported along the path;

an end station located downstream from the beamline assembly along the path, the end station being adapted to support a wafer along the path for implantation using the ion beam, wherein the beamline assembly comprises a mass analyzer receiving the ion beam from the ion source along the path and directing ions of a desired charge-to-mass ratio along the path toward the end station; and a time of flight ion beam energy measurement system for measuring an average kinetic energy of an ion included in a selected ion pulse of the ion beam, the time of flight ion beam energy measurement system comprising:
  first and second sensors spaced apart from one another by a sensor distance along the path, the second sensor being downstream of the first sensor, the first sensor generating a first sensor signal when an ion pulse of the ion beam passes the first sensor and the second sensor generating a second sensor signal when the ion pulse passes the second sensor;
  a time delay measurement system for measuring a time delay between the first and second sensor signals, comprising:
    a first channel receiving the first sensor signal;
    a second channel receiving the second sensor signal;
    a delay apparatus associated with one of the first and second channels, the delay apparatus being operable to selectively provide a variable delay to a sensor signal associated with the one of the first and second channels; and
    a correlator apparatus having first and second correlator inputs receiving outputs from the first and second channels, respectively, and a correlator output providing a correlator output signal having an ascertainable correlator output when a delay value of the variable delay is representative of the time delay between the first and second input signals; and measurement circuitry receiving the correlator output signal, the measurement circuitry being adapted to control the delay apparatus to selectively adjust the variable delay while monitoring the correlator output signal, to determine a first delay value corresponding to the ascertainable correlator output value when the delay value of the variable delay is representative of the time delay between the first and second input signals, and to determine a measured ion beam energy according to the first delay value, a mass of particles in the ion beam, and the sensor distance.

18. The ion implantation system of claim 17, wherein the correlator provides a minimum output value when the outputs from the first and second channels are substantially aligned in time.

19. The ion implantation system of claim 17, wherein the time delay measurement system further comprises an amplitude adjustment apparatus operable to selectively adjust a gain associated with one of the first and second channels, wherein the measurement circuitry is adapted to:

control the delay apparatus to adjust the variable delay to the first delay value, control the amplitude adjustment apparatus to selectively adjust the gain while monitoring the correlator output signal, determine a first gain value corresponding to the ascertainable correlator output value, control the amplitude adjustment apparatus to adjust the gain to the first gain value, control the delay apparatus to again selectively adjust the variable delay while monitoring the correlator output signal, determine a second delay value corresponding to the ascertainable correlator output value when a delay value of the variable delay is representative of the time delay between the first and second input signals, and determine a measured ion beam energy according to the second delay value, the mass of particles in the ion beam, and the sensor distance.

20. A method of measuring a time delay between first and second input signals, comprising:

providing a variable time delay in one of the first and second input signals;

correlating the time delayed one of the first and second input signals with the other of the first and second input signals to generate a correlated output signal;

adjusting the variable time delay to a delay value at which the correlated output signal is an ascertainable value when a delay value of the variable delay is representative of the time delay between the time delayed one of the first and second input signals and the other of the first and second input signals; and determining a measured time delay according to the delay value at which the correlated output signal is the ascertainable value.

21. The method of claim 20, wherein correlating the time delayed one of the first and second input signals with the other of the first and second input signals comprises subtracting the time delayed one of the first and second input signals and the other of the first and second input signals to generate the correlated output signal, wherein the correlated output signal is a minimum when the time delayed one of the first and second input signals with the other of the first and second input signals are substantially aligned in time, and wherein adjusting the variable time delay comprises adjusting the variable time delay to a delay value at which the correlated output signal is minimum.

22. The method of claim 21, further comprising adjusting a variable amplitude in one of the input signals to a value at which the correlated output signal is minimum, and again adjusting the variable time delay to a delay value at which the correlated output signal is minimum before determining the measured time delay.

23. The method of claim 20, further comprising adjusting a variable amplitude in one of the input signals to a value at which the correlated output signal is the ascertainable value, and again adjusting the variable time delay to a delay value at which the correlated output signal is the ascertainable value before determining the measured time delay.

24. A method of measuring an average kinetic energy of particles in an ion beam, comprising:

inputting first and second input signals from first and second spaced ion beam sensors in an ion implantation system;

providing a variable time delay in one of the first and second input signals;

correlating the time delayed one of the first and second input signals with the other of the first and second input signals to generate a correlated output signal;

adjusting the variable time delay to a delay value at which the correlated output signal is an ascertainable value when a delay value of the variable delay is representative of the time delay between the time delayed one of the first and second input signals and the other of the first and second input signals;

determining a measured beam velocity according to the delay value at which the correlated output signal is the ascertainable value and a distance between the sensors; and computing an average kinetic energy of particles in the ion beam according to the measured beam velocity and a mass of particles in the ion beam.

25. The method of claim 24, wherein correlating the time delayed one of the first and second input signals with the other of the first and second input signals comprises subtracting the time delayed one of the first and second input signals and the other of the first and second input signals to generate the correlated output signal, wherein the correlated output signal is a minimum when the time delayed one of the first and second input signals with the other of the first and second input signals are substantially aligned in time, and wherein adjusting the variable time delay comprises adjusting the variable time delay to a delay value at which the correlated output signal is minimum.

26. The method of claim 25, further comprising adjusting a variable amplitude in one of the input signals to a value at which the correlated output signal is minimum, and again adjusting the variable time delay to a delay value at which the correlated output signal is minimum before determining the measured beam velocity.

27. The method of claim 24, further comprising adjusting a variable amplitude in one of the input signals to a value at which the correlated output signal is the ascertainable value, and again adjusting the variable time delay to a delay value at which the correlated output signal is the ascertainable value before determining the measured beam velocity.

28. A method for calibrating a time of flight energy measurement system in an ion implantation system, the method comprising:

providing a single DC ion beam at a single known DC beam energy along a beam path in the ion implantation system;

modulating the single DC ion beam with a small AC component;

measuring a single beam energy using the time of flight energy measurement system; and calibrating the time of flight energy measurement system according to the single measured beam energy and the single known DC beam energy.

29. The method of claim 28, wherein modulating the single DC ion beam with a small AC component comprises energizing an RF accelerator in the ion implantation system at a low voltage to generate pulse signals in time of flight system probes without substantially changing an average energy of the single DC ion beam.

30. The method of claim 28, wherein calibrating the time of flight energy measurement system according to the single measured beam energy and the single known DC beam energy comprises computing an energy offset value according to the single measured beam energy and the single known DC beam energy.

31. A system for measuring a time delay between first and second pulse streams, comprising:

a first channel receiving a first input pulse stream;

a second channel receiving a second input pulse stream;

a programmable delay line associated with one of the first and second channels, the delay line being adapted to selectively provide a variable delay to a pulse stream associated with the one of the first and second channels; and a correlator receiving the first and second pulse streams from the first and second channels, respectively, the correlator being adapted to provide an ascertainable output value when the pulse streams from the first and second channels are substantially aligned in time.

32. The apparatus of claim 31, wherein the correlator is adapted to provide a minimum output value when the pulse streams from the first and second channels are substantially aligned in time.

* * * * *